United States Patent
Kawadahara

(10) Patent No.: US 12,002,700 B2
(45) Date of Patent: Jun. 4, 2024

(54) SUBSTRATE BONDING APPARATUS AND METHOD OF MANUFACTURING A SEMICONDUCTOR DEVICE

(71) Applicant: Kioxia Corporation, Tokyo (JP)

(72) Inventor: Sho Kawadahara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 414 days.

(21) Appl. No.: 17/346,743

(22) Filed: Jun. 14, 2021

(65) Prior Publication Data

US 2022/0076980 A1 Mar. 10, 2022

(30) Foreign Application Priority Data

Sep. 8, 2020 (JP) .................. 2020-150678

(51) Int. Cl.
*H01L 21/683* (2006.01)
*H01L 23/00* (2006.01)

(52) U.S. Cl.
CPC ............ *H01L 21/683* (2013.01); *H01L 24/74* (2013.01); *H01L 24/741* (2013.01); *H01L 24/743* (2013.01); *H01L 24/744* (2013.01); *H01L 24/80* (2013.01); *H01L 24/81* (2013.01); *H01L 24/82* (2013.01); *H01L 24/83* (2013.01); *H01L 24/84* (2013.01); *H01L 24/94* (2013.01); *H01L 24/95* (2013.01); *H01L 2224/75733* (2013.01); *H01L 2224/75734* (2013.01); *H01L 2224/76733* (2013.01); *H01L 2224/77733* (2013.01); *H01L 2224/8022* (2013.01); *H01L 2224/8122* (2013.01); *H01L 2224/8221* (2013.01); *H01L 2224/8322* (2013.01); *H01L 2224/8421* (2013.01); *H01L 2224/9512* (2013.01); *H01L 2224/95133* (2013.01); *H01L 2224/95144* (2013.01); *H01L 2224/95145* (2013.01)

(58) Field of Classification Search
CPC ........... H01L 24/741–744; H01L 24/94; H01L 24/95; H01L 24/81–84; H01L 2224/95133; H01L 2224/8022; H01L 2224/8122; H01L 2224/8221; H01L 2224/8322; H01L 2224/8421; H01L 2224/75733; H01L 2224/76733; H01L 2224/77733; H01L 2224/9512; H01L 2224/95144; H01L 2224/95145
See application file for complete search history.

(56) References Cited

U.S. PATENT DOCUMENTS 10,777,527 B1 * 9/2020 Chen .................. H01L 24/80

FOREIGN PATENT DOCUMENTS

| JP | 3318776 B2 | 8/2002 |
|----|------------|--------|
| JP | 2012-79818 A | 4/2012 |
| JP | 2013-232663 A | 11/2013 |

(Continued)

*Primary Examiner* — David A Zarneke
(74) *Attorney, Agent, or Firm* — Oblon, McClelland, Maier & Neustadt, L.L.P.

(57) ABSTRACT

According to one embodiment, there is provided a substrate bonding apparatus including a first chuck stage and a second chuck stage. The first chuck stage includes a first electromagnetic force generation unit. The first chuck stage is chuckable for a first substrate. The second chuck stage includes a second electromagnetic force generation unit. The second electromagnetic force generation unit faces the first electromagnetic force generation unit. The second chuck stage is chuckable for a second substrate.

17 Claims, 21 Drawing Sheets

(56) References Cited

FOREIGN PATENT DOCUMENTS

| | | |
|---|---|---|
| JP | 2015-146339 A | 8/2015 |
| JP | 2018-190826 A | 11/2018 |
| TW | 200526801 A | 8/2005 |
| WO | WO 2016/093284 A1 | 9/2017 |

* cited by examiner

FIG.4A
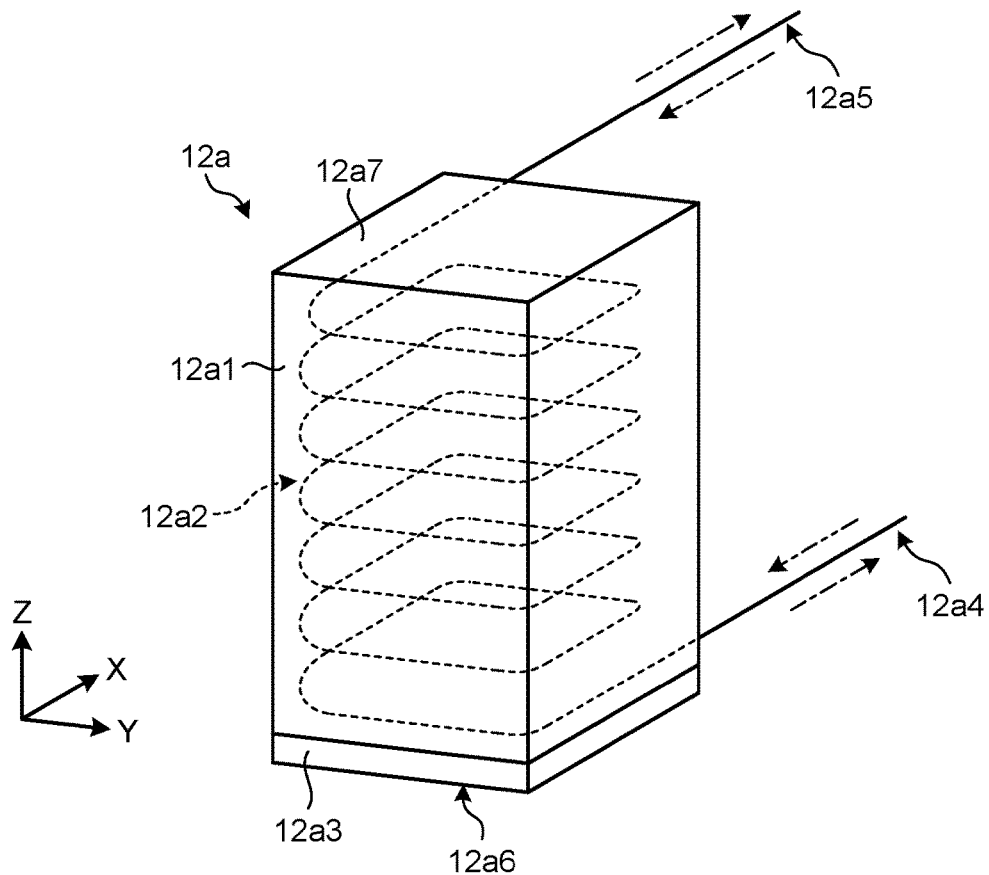
FIG.4B
FIG.4C  FIG.4D
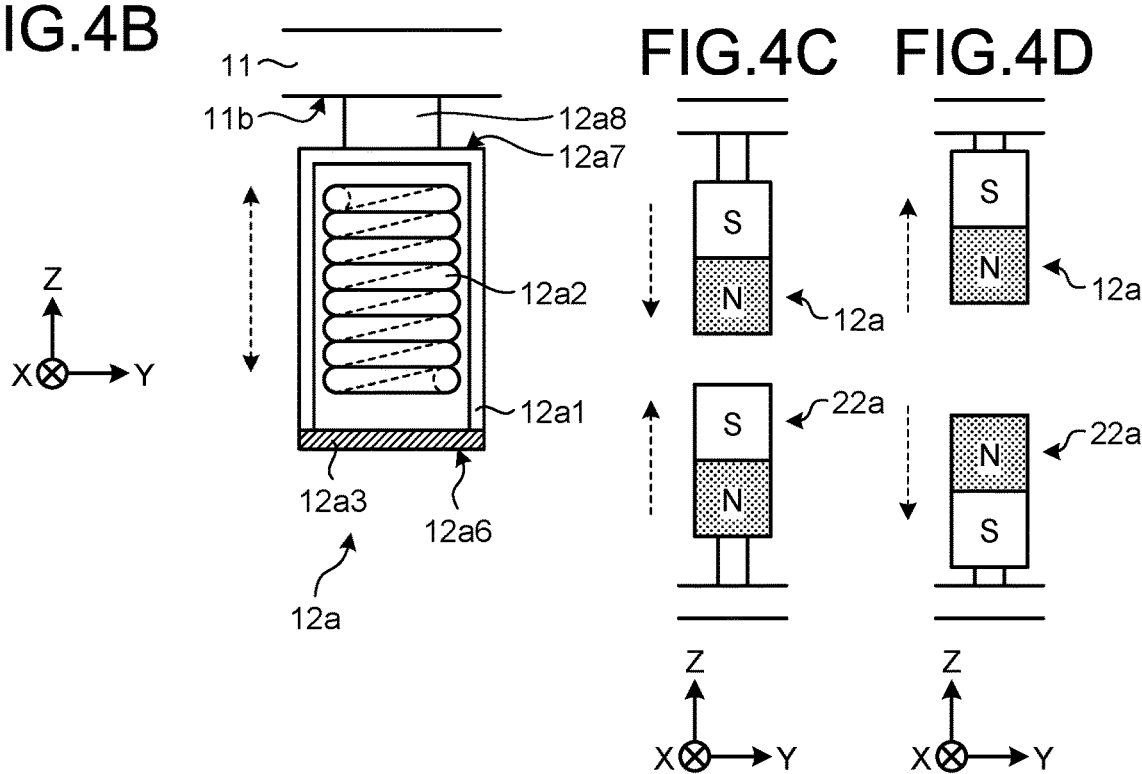

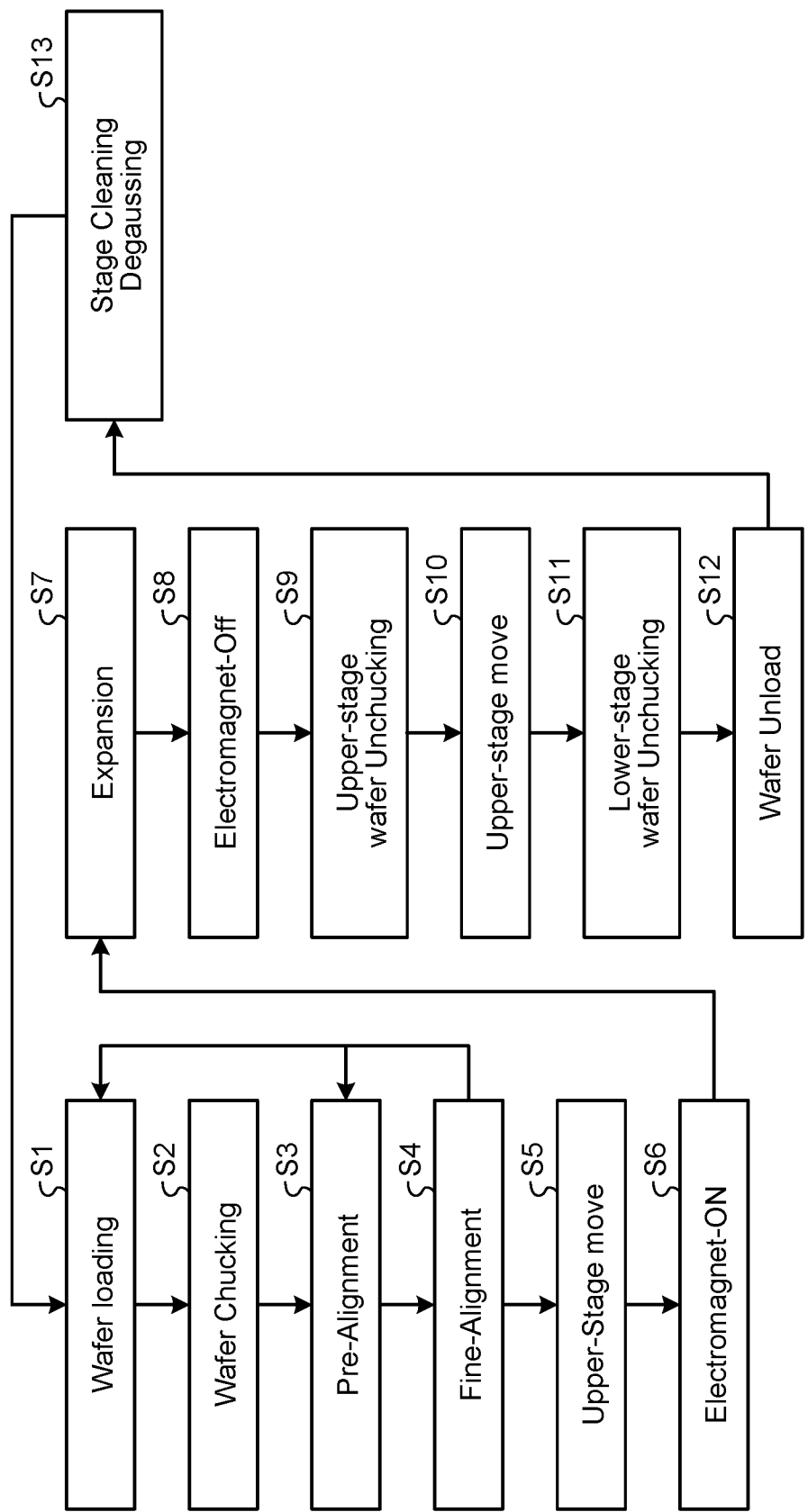

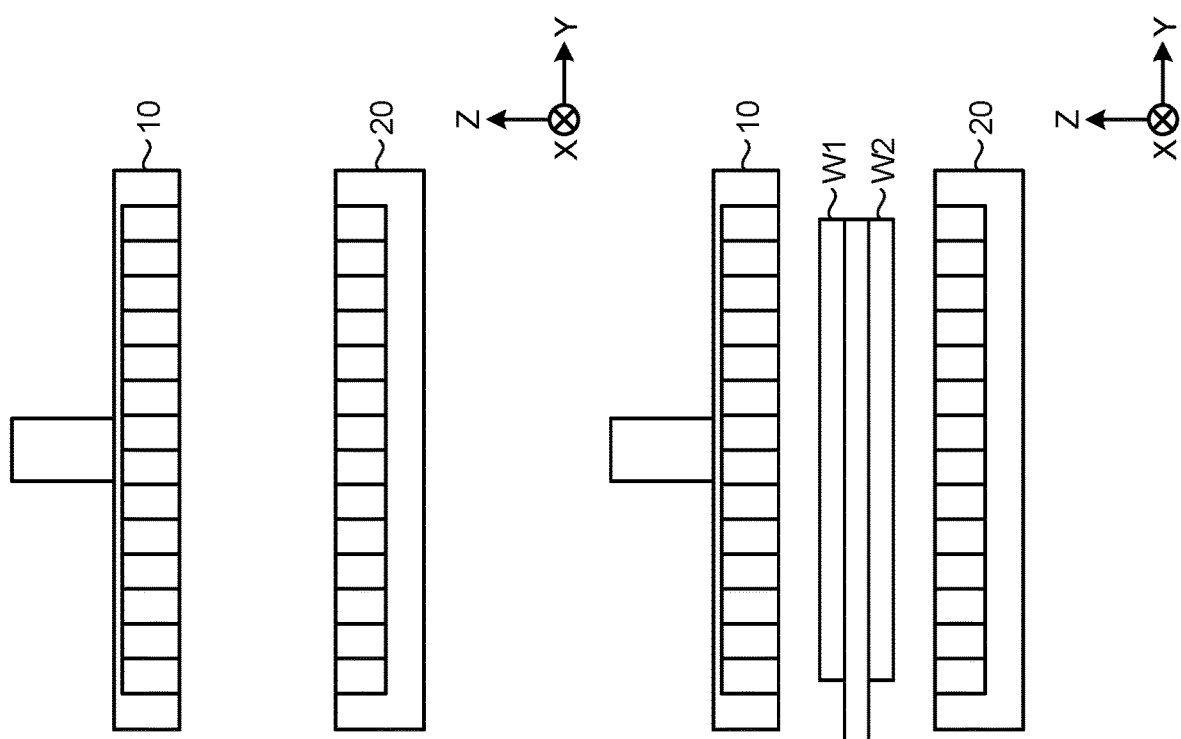
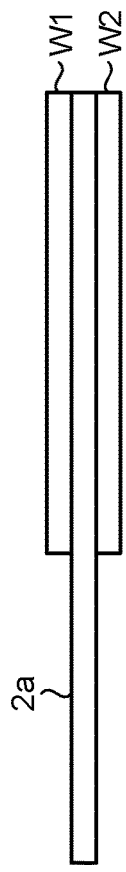
FIG.6A
FIG.6B

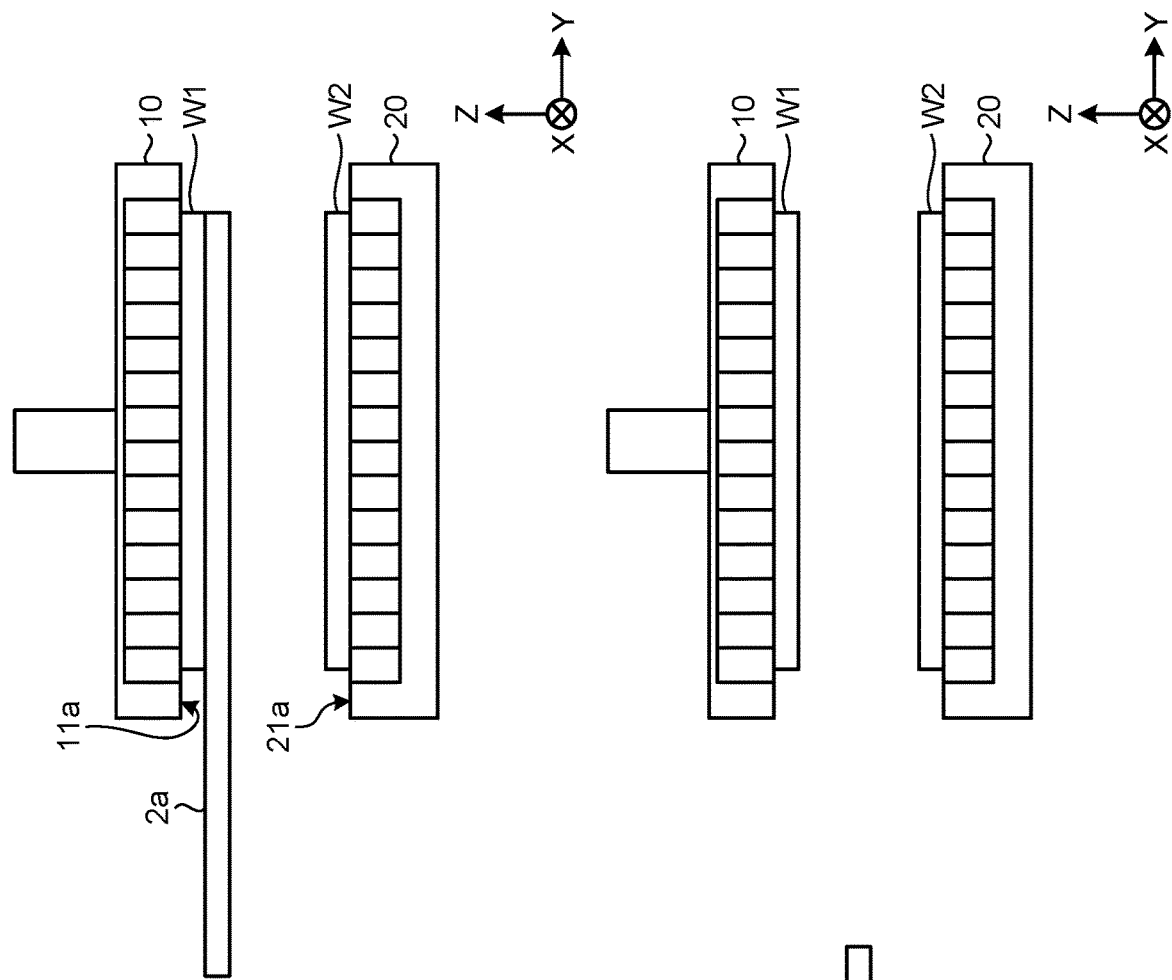

FIG.13A
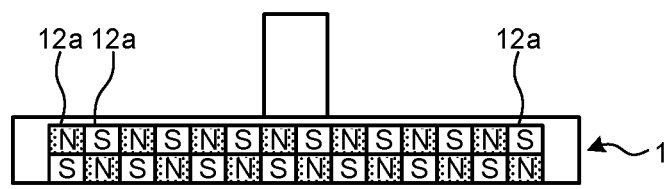
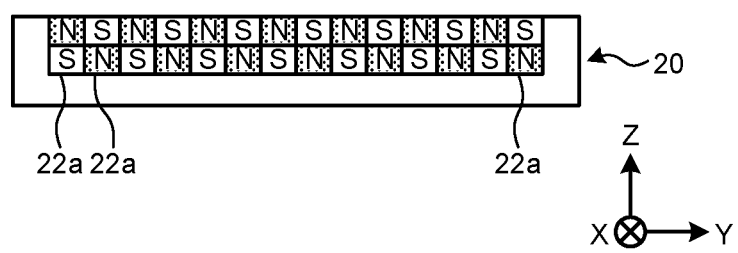
FIG.13B
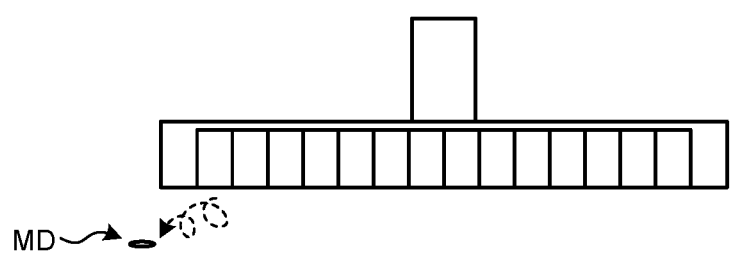
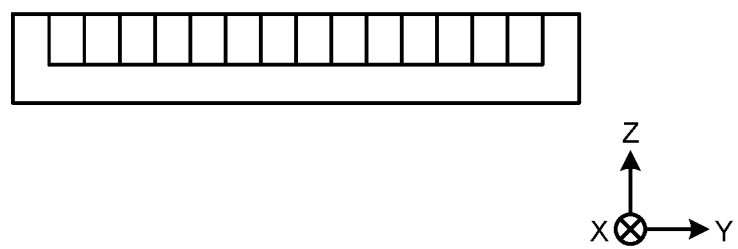

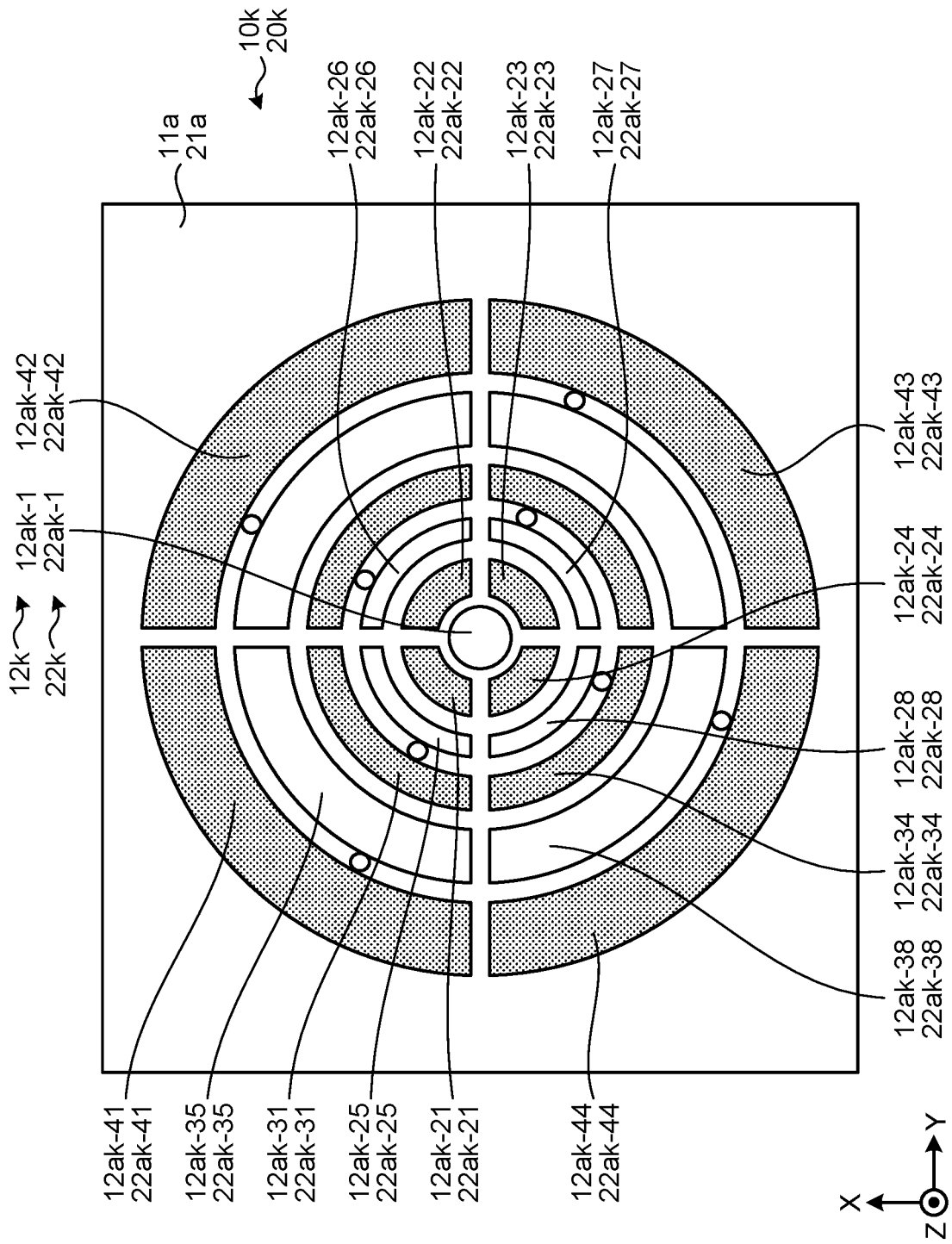

SUBSTRATE BONDING APPARATUS AND METHOD OF MANUFACTURING A SEMICONDUCTOR DEVICE

CROSS-REFERENCE TO RELATED APPLICATIONS

This application is based upon and claims the benefit of priority from Japanese Patent Application No. 2020-150678, filed on Sep. 8, 2020; the entire contents of which are incorporated herein by reference.

FIELD

Embodiments described herein relate generally to a substrate bonding apparatus, and method of manufacturing a semiconductor device.

BACKGROUND

A substrate bonding apparatus bonds two substrates together by chucking two substrates onto two chuck stages and bringing the two chuck stages close to each other. At this time, it is desirable to appropriately bond the two substrates together.

BRIEF DESCRIPTION OF THE DRAWINGS

FIGS. 4A to 4D are diagrams illustrating the configuration of an electromagnetic element in the embodiment;

FIG. 5 is a flowchart illustrating an operation of the substrate bonding apparatus according to the embodiment;

FIGS. 6A and 6B are diagrams illustrating the operation of the substrate bonding apparatus according to the embodiment;

FIGS. 7A and 7B are diagrams illustrating the operation of the substrate bonding apparatus according to the embodiment;

FIGS. 13A and 13B are diagrams illustrating the operation of the substrate bonding apparatus according to the embodiment;

FIG. 20 is a diagram illustrating the configuration of a chuck stage in a third modification of the embodiment.

DETAILED DESCRIPTION

Figure 1:
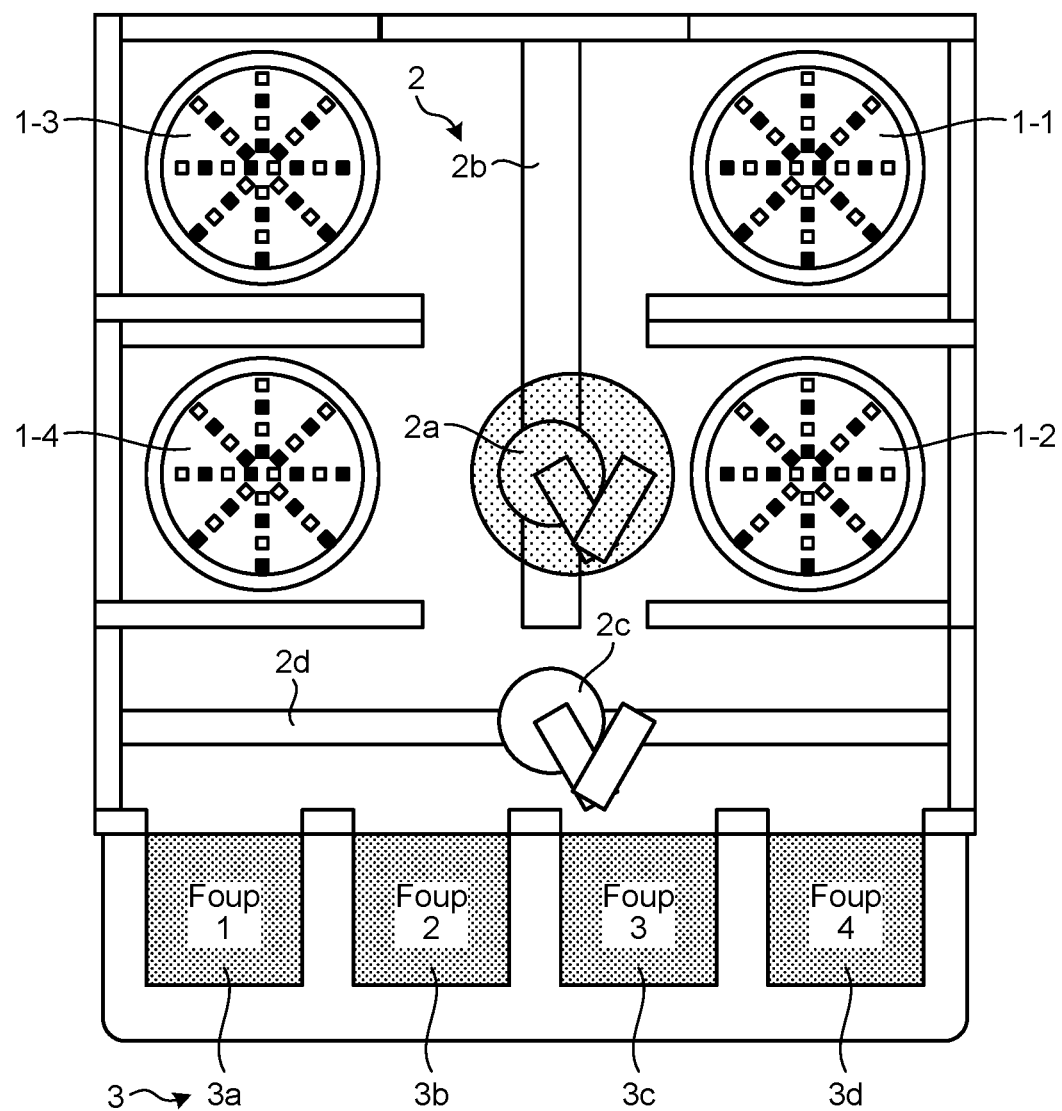
FIG. 1 is a diagram illustrating the configuration of a manufacturing system to which a substrate bonding apparatus according to an embodiment is applied.

In general, according to one embodiment, there is provided a substrate bonding apparatus including a first chuck stage and a second chuck stage. The first chuck stage includes a first electromagnetic force generation unit. The first chuck stage is chuckable for a first substrate. The second chuck stage includes a second electromagnetic force generation unit. The second electromagnetic force generation unit faces the first electromagnetic force generation unit. The second chuck stage is chuckable for a second substrate.

Exemplary embodiments of a substrate bonding apparatus will be explained below in detail with reference to the accompanying drawings. The present invention is not limited to the following embodiments.

Embodiment

A substrate bonding apparatus according to an embodiment chucks two substrates (e.g., two wafers) onto two chuck stages and bonds the two substrates together. For example, it is possible to achieve higher density and enhanced functionality of a semiconductor integrated circuit by joining electrodes of two substrates together to constitute the semiconductor integrated circuit. That is, junction electrodes are formed on the surfaces of two substrates to be paired, and the two substrates are stacked to join the electrodes together, thereby completing stacking of the substrates. In the stacked substrate, if a void (cavity) is present on a bonding interface, it may become difficult to achieve a function required of the stacked substrate (e.g., electrical joining between the electrodes).

In a bonding technique for bonding two substrates together, the two substrates may be bonded together by pressing the first substrate against the second substrate by using a pressing member such as a striker. At this time, an end of the first substrate can come into contact with the second substrate due to its own weight. Although central parts of the substrates to which pressure is applied by the pressing member are press-fitted with each other, pressure may be unintentionally applied to outer peripheral parts of the substrates due to the own weight of the substrate. If edges of the substrates are joined together due to the unintentional pressure, there is a high possibility that air (a cause of a void defect) between the substrates is not sufficiently removed. That is, if the outer peripheral parts of the substrates are press-fitted with each other before parts on the inner side relative to the outer peripheral parts are press-fitted with each other, air is not sufficiently removed, which causes a void defect. Thus, a substrate bonding apparatus desirably performs a bonding operation for reducing the formation of voids (cavities) on the interface.

On the other hand, it can be considered that a substrate bonding apparatus includes a plurality of electromagnets disposed within a lower chuck stage and a magnetic board disposed on an upper chuck stage. In this case, the substrate bonding apparatus controls the electromagnets independently of each other with two substrates chucked on the two chuck stages to cause the electromagnets to generate magnetic force and cause the magnetic board to function as a yoke. This makes it possible to cause pressurizing force that is two-dimensionally distributed to act between the two substrates.

However, in this substrate bonding apparatus, there is apprehension that residual magnetism is unintentionally produced on the magnetic board of the upper chuck stage, and magnetic dust remains attracted to the magnetic board. In the substrate bonding apparatus, if magnetic dust remains attracted to the upper chuck stage, the flatness of the surface of the upper chuck stage may be deteriorated, and the upper chuck stage may thus become unable to chuck the substrate. Even if the upper chuck stage can chuck the substrate, the substrate bonding apparatus may cause the formation of a void (cavity) on the bonding interface or damage the substrates when bonding the two substrates together.

Further, as for substrate-level integration by bonding the substrates, there is another apprehension. In the substrate, instead of two-dimensional finer integration, higher degree of integration through stacking of three-dimensional circuit patterns are performed (i.e., many layers are stacked) to form a structure as represented by a three-dimensional memory (e.g., a three-dimensional flash memory). As a result, anisotropic stress strain caused by the higher degree of integration (i.e., stacking of many layers) may cause a large warpage of the substrate, which may result in complicated topography of the surface shape of the substrate. In this case, if the substrate bonding apparatus causes the pressurizing force to act on the substrates from above by using a flat magnetic board having high stiffness, it is difficult to follow the complicated topography of the substrate surfaces, which may damage the substrates.

Thus, in the substrate bonding apparatus according to the embodiment, each of the upper and lower chuck stages is provided with an electromagnetic force generation unit capable of two-dimensionally adjusting the magnetic force, thereby enabling the bond following the topography of the substrate surfaces while reducing magnetic dust.

Specifically, the substrate bonding apparatus chucks the substrates onto the respective upper and lower chuck stages and selectively causes the upper and lower electromagnetic force generation units to generate electromagnetic force at a predetermined location (e.g., the center). In this manner, the substrate bonding apparatus causes the pressurizing force to act on the upper and lower substrates at the predetermined location on the upper and lower electromagnetic force generation units and brings the upper and lower substrates into contact with each other at the predetermined location. The substrate bonding apparatus sequentially expands a region where the electromagnetic force is to be generated in the plane direction from the predetermined location serving as a starting point on the upper and lower electromagnetic force generation units and advances a contact end between the upper and lower substrates in the plane direction. At this time, the substrate bonding apparatus can adjust the magnitude of the electromagnetic force in any manner by, for example, adjusting the magnitude of current and cause the pressurizing force to act on the substrates while adjusting the magnitude of the pressurizing force so as to follow the topography of the substrate surfaces. This makes it possible to bond the upper and lower substrates together while following the topography of the substrate surfaces and reducing the generation of voids (cavities) on a bonding interface. The substrate bonding apparatus cancels the electromagnetic force generation of the upper and lower electromagnetic force generation units after bonding upper and lower substrates together. The substrate bonding apparatus may cause each of the upper and lower electromagnetic force generation units to generate electromagnetic force of a polarity opposite to the polarity at bonding after the bonded stacked substrate is unloaded. Thus, if there is a magnetized part in the upper and lower chuck stages, it is possible to degauss the magnetized part. Thus, magnetic dust can be easily removed. Therefore, it is possible to achieve the bond following the topography of the substrate surfaces while reducing magnetic dust.

More specifically, a manufacturing system 100 to which a substrate bonding apparatus 1 is applied can be configured as illustrated in FIG. 1. FIG. 1 is a diagram illustrating the configuration of the manufacturing system 100 to which the substrate bonding apparatus 1 is applied. The manufacturing system 100 includes a plurality of substrate bonding apparatuses 1-1 to 1-4, a conveyance system 2, and a loading/unloading unit 3. The substrate bonding apparatuses 1 can be configured in a similar manner. Each of the substrate bonding apparatuses 1 includes a chuck stage for chucking an upper wafer and a chuck stage for chucking a lower wafer. Hereinbelow, a direction perpendicular to a principal surface of the chuck stage is defined as a Z direction, and two directions perpendicular to each other within a plane perpendicular to the Z direction are defined as an X direction and a Y direction. Each of the plurality of substrate bonding apparatuses 1-1 to 1-4 is sealed by a closed vessel to reduce a pressure therein and is configured to reduce the pressure within the substrate bonding apparatuses 1 after the substrate is conveyed therein.

The conveyance system 2 is disposed across the substrate bonding apparatuses 1-1 to 1-4. For example, the conveyance system 2 includes a conveyance rail 2b extending in the X direction, a conveyance robot 2a movable in the X direction along the conveyance rail 2b, a conveyance rail 2d extending in the Y direction, and a conveyance robot 2c movable in the Y direction along the conveyance rail 2d. The substrate bonding apparatuses 1-1 to 1-4 are disposed at the +Y side of the conveyance system 2 and arranged in the X direction along the conveyance rail 2b. The substrate bonding apparatuses 1-1 and 1-2 are disposed at the −Y side of the conveyance rail 2b and arranged in the X direction along the conveyance rail 2b. The substrate bonding apparatuses 1-3 and 1-4 are disposed at the +Y side of the conveyance rail 2b and arranged in the X direction along the conveyance rail 2b.

The loading/unloading unit 3 is disposed adjacent to the conveyance system 2. The loading/unloading unit 3 includes a plurality of placement bases (a plurality of Foups) 3a to 3d. The placement bases 3a to 3d are disposed at the −X side of the conveyance system 2 and arranged in the Y direction along the conveyance rail 2d. A cassette that houses a plurality of wafers (e.g., 25 wafers) is placed on each of the placement bases 3a to 3d.

The conveyance system 2 is capable of conveying an unbonded wafer or a bonded stacked wafer between each of the placement bases 3a to 3d and each of the substrate bonding apparatuses 1-1 to 1-4. This makes it possible to perform bonding operations of the substrate bonding apparatuses 1-1 to 1-4 in tandem with each other and efficiently perform the bonding operations on a plurality of sets of wafers.

Figure 2:
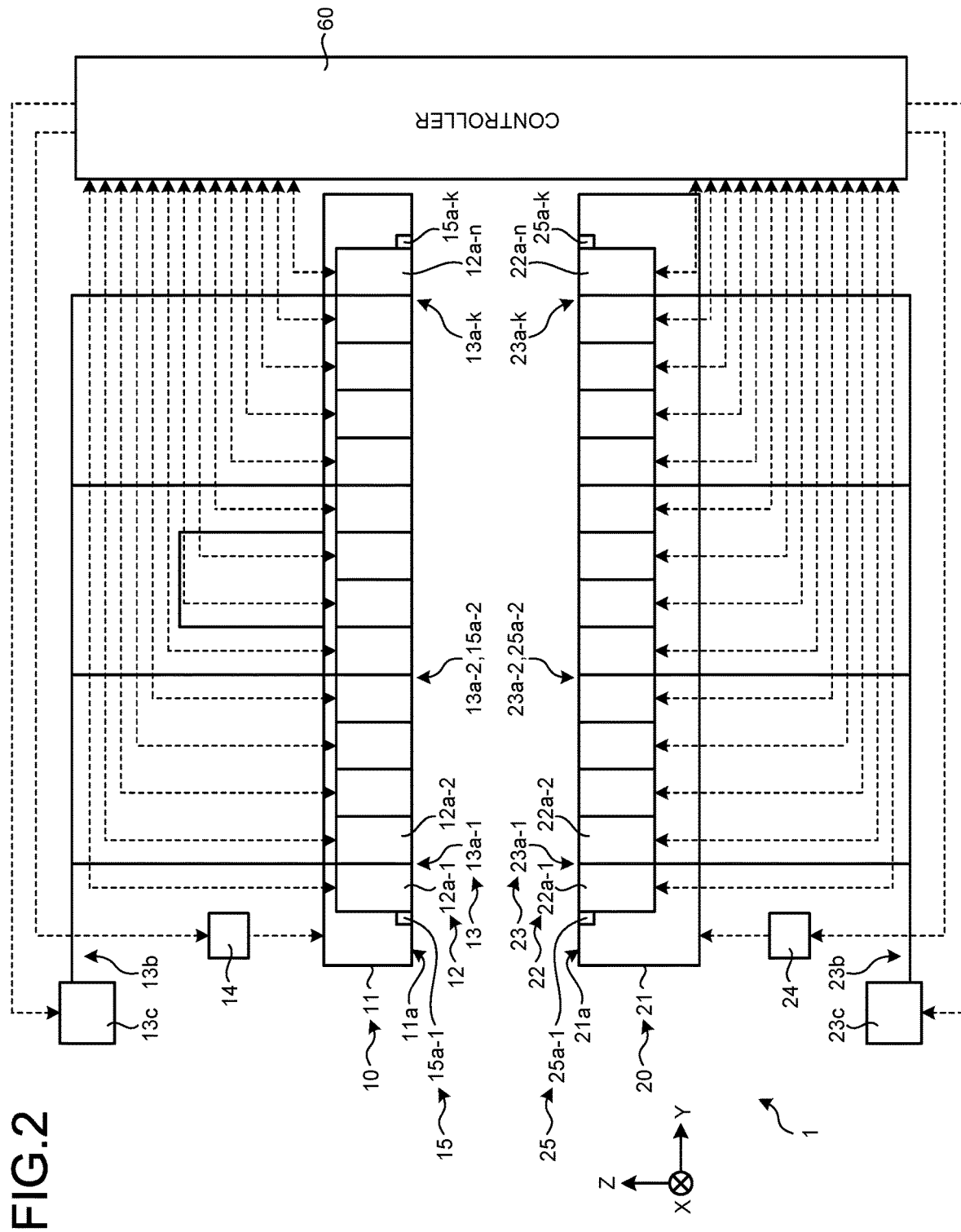
FIG. 2 is a diagram illustrating the configuration of the substrate bonding apparatus according to the embodiment.

Each of the substrate bonding apparatuses 1 can be configured as illustrated in FIG. 2. FIG. 2 is a diagram illustrating the configuration of the substrate bonding apparatus 1.

The substrate bonding apparatus 1 includes a chuck stage 10, a chuck stage 20, and a controller 60. It should be noted that each of the chuck stage 10, the chuck stage 20 and the space between them is sealed by a closed vessel to reduce a pressure therein and is configured to reduce the pressure within the substrate bonding apparatuses 1 after loading the substrate therein.

The chuck stage 10 and the chuck stage 20 are disposed facing each other when used. The chuck stage 10 includes a stage base 11 having a substantially flat plate-like outer shape. The chuck stage 20 includes a stage base 21 having a substantially flat plate-like outer shape. The stage base 11 has a principal surface 11a on the side facing the stage base 21. The stage base 21 has a principal surface 21a on the side facing the stage base 11. Each of the principal surface 11a and the principal surface 21a is substantially perpendicular to the Z direction.

The chuck stage 10 includes, in addition to the stage base 11, an electromagnetic force generation unit 12, a chuck unit 13, a drive mechanism 14, and an imaging unit 15.

The stage base 11 is a flat plate-like member extending in the XY direction and includes a recess recessed in the +Z direction from the −Z side.

The electromagnetic force generation unit 12 is housed in the recess of the stage base 11. The electromagnetic force generation unit 12 is capable of generating electromagnetic force that is two-dimensionally distributed in accordance with control of the controller 60. The electromagnetic force generation unit 12 includes a plurality of electromagnetic elements 12a-1 to 12a-n. The electromagnetic elements 12a-1 to 12a-n are arranged in the XY direction and each configured to be displaceable in the Z direction. Each of the electromagnetic elements 12a-1 to 12a-n may be an electromagnet.

Figure 3:
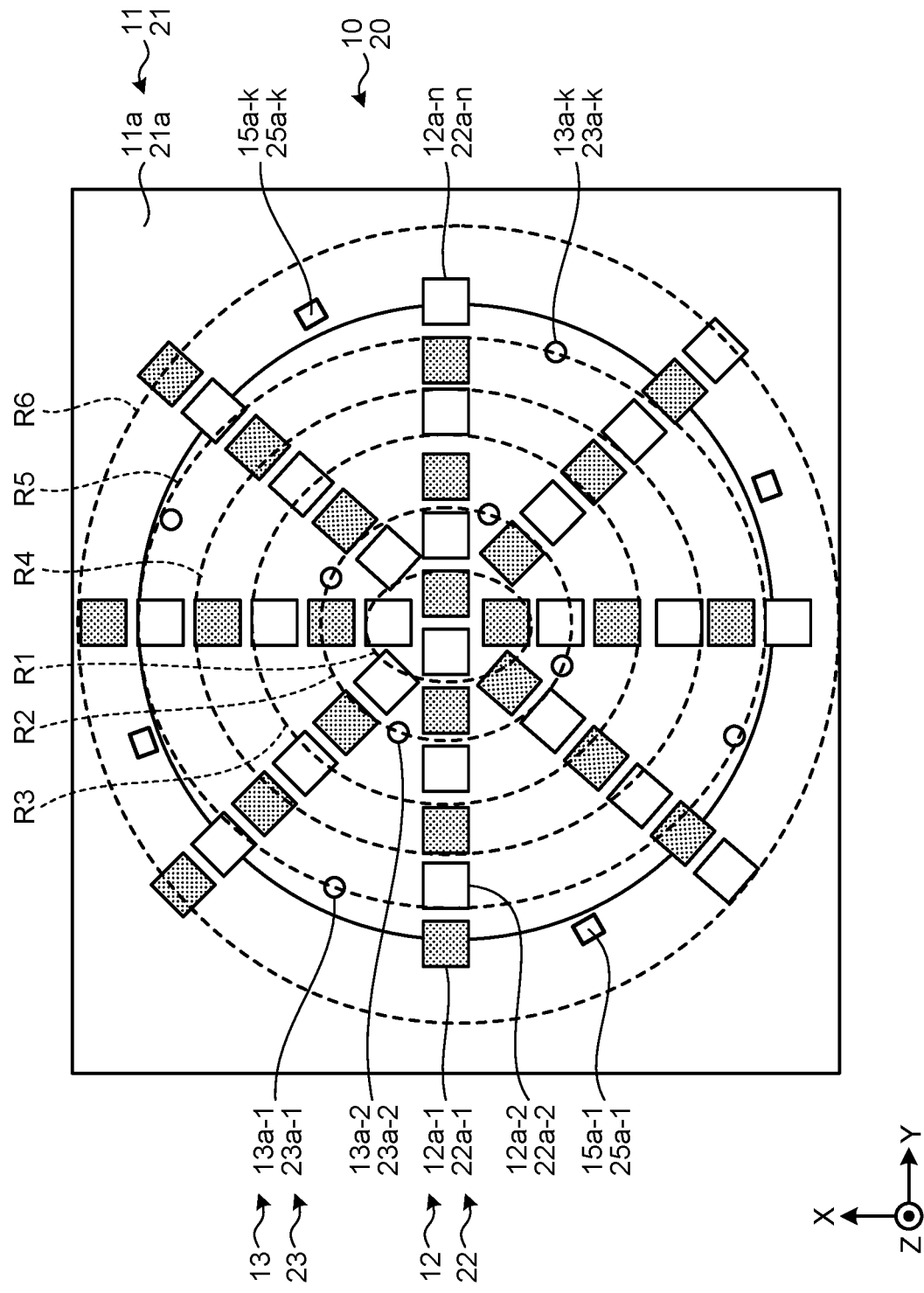
FIG. 3 is a diagram illustrating the configuration of a chuck stage in the embodiment.

For example, the electromagnetic elements 12a-1 to 12a-n are radially arranged on the principal surface 11a of the stage base 11 as illustrated in FIG. 3. FIG. 3 is a plan view illustrating the configuration of the chuck stage 10. FIG. 3 illustrates, as an example of a plane configuration in a perspective view of the chuck stage 10 in the Z direction, a case where the arrangement of the electromagnetic elements 12a-1 to 12a-n is a combination of a cross-shaped arrangement in the XY direction and an oblique cross-shaped arrangement obtained by rotating the cross-shaped arrangement in the XY direction around the Z axis. The center of the cross-shaped arrangement and the center of the oblique cross-shaped arrangement are disposed near the center of the stage base 11.

The chuck unit 13 is disposed between the electromagnetic elements 12a-1 to 12a-n. The chuck unit 13 is a vacuum chuck mechanism or an electrostatic chuck mechanism. In a case where the chuck unit 13 is the vacuum chuck mechanism, as illustrated in FIG. 2, the chuck unit 13 includes a plurality of chuck holes 13a-1 to 13a-k, a vacuum pipe 13b, and a vacuum pump 13c. Each of the chuck holes 13a communicates with the vacuum pump 13c through the vacuum pipe 13b. The vacuum pump 13c can evacuate the chuck holes 13a through the vacuum pipe 13b in accordance with the control of the controller 60. This enables the chuck unit 13 to chuck the wafer.

The drive mechanism 14 collectively and globally moves the electromagnetic elements 12a-1 to 12a-n by driving the stage base 11 in the XYZ direction in accordance with the control of the controller 60. The electromagnetic elements 12a-1 to 12a-n are capable of individually generating the electromagnetic force in accordance with the control of the controller 60. Each of the electromagnetic elements 12a-1 to 12a-n is supported on the stage base 11 in such a manner that a principal part thereof is displaceable in the +Z direction and the −Z direction.

For example, as illustrated in FIGS. 4A and 4B, each of the electromagnetic elements 12a includes a housing 12a1, a coil 12a2, a cushioning member 12a3, a conducting wire 12a4, a conducting wire 12a5, and an elastic member 12a8. The housing 12a1 has a substantially rectangular parallelepiped shape that is open on the −Z side and has a longitudinal direction aligned with the Z direction. The coil 12a2 is housed inside the housing 12a1 and includes a conducting wire that is wound so as to generate the electromagnetic force in the Z direction. The coil 12a2 has one end electrically connected to the controller 60 through the conducting wire 12a4 and the other end electrically connected to the controller 60 through the conducting wire 12a5. The cushioning member 12a3 has a substantially flat plate-like shape extending in the XY direction and closes the housing 12a1 from the −Z side. The cushioning member 12a3 dampens force applied to the back surface of the wafer when the electromagnetic element 12a applies pressure to the wafer and absorbs a deviation in parallelism between a pressurizing surface 12a6 and the back surface of the wafer to make the force applied to the back surface of the wafer uniform. The cushioning member 12a3 can include, for example, an elastic body such as rubber. As illustrated in FIG. 4B, the elastic member 12a8 connects a surface 12a7 of the housing 12a1, the surface 12a7 being located on the side opposite to the pressurizing surface 12a6, to an inner wall surface 11b of the stage base 11 and elastically deformably supports the housing 12a1. The elastic member 12a8 can include, for example, an elastic body such as rubber. This enables the housing 12a1 and the cushioning member 12a3 to elastically deform in the +Z direction and the −Z direction as indicated by a dotted arrow in FIG. 4B.

The conducting wire 12a4 and the conducting wire 12a5 illustrated in FIG. 4A are electrically connected between the coil 12a2 and the controller 60, and current flows therethrough in a direction corresponding to the electromagnetic force to be generated in the coil 12a2. When current flows in a direction indicated by a dot-dot-dash line in FIG. 4A, that is, flows through the controller 60, the conducting wire 12a4, the coil 12a2, the conducting wire 12a5, and the controller 60 in this order, the electromagnetic element 12a functions as a magnet with the pressurizing surface 12a6 serving as the N pole and the surface 12a7 serving as the S pole. When current flows in direction indicated by a dot-dash line in FIG. 4A, that is, flows through the controller 60, the conducting wire 12a5, the coil 12a2, the conducting wire 12a4, and the controller 60 in this order, the electromagnetic element 12a functions as a magnet with the pressurizing surface 12a6 serving as the S pole and the surface 12a7 serving as the N pole.

The imaging unit 15 illustrated in FIG. 2 is disposed between the electromagnetic elements 12a-1 to 12a-n (refer to FIG. 3). The imaging unit 15 includes a plurality of image pickup devices 15a-1 to 15a-k. The plurality of image pickup devices 15a-1 to 15a-k receives visible light or infrared light and captures an image of a reference mark on the wafer at alignment in accordance with the control of the controller 60. Each of the image pickup devices 15a-1 to 15a-k may include a camera including, for example, a CCD image sensor or a CMOS image sensor.

The chuck stage 20 includes, in addition to the stage base 21, an electromagnetic force generation unit 22, a chuck unit 23, a drive mechanism 24, and an imaging unit 25.

The stage base 21 is a flat plate-like member extending in the XY direction and includes a recess recessed in the +Z direction from the −Z side.

The electromagnetic force generation unit 22 is housed in the recess of the stage base 21. The electromagnetic force generation unit 22 is capable of generating electromagnetic force that is two-dimensionally distributed in accordance with control of the controller 60. The electromagnetic force generation unit 22 includes a plurality of electromagnetic elements 22a-1 to 22a-n. The electromagnetic elements 12a-1 to 12a-n are arranged in the XY direction and each configured to be displaceable in the Z direction. Each of the electromagnetic elements 22a-1 to 22a-n may be an electromagnet.

For example, the electromagnetic elements 22a-1 to 22a-n are radially arranged on the principal surface 21a of the stage base 21 as illustrated in FIG. 3. FIG. 3 is a plan view illustrating the configuration of the chuck stage 20. FIG. 3 illustrates, as an example of a plane configuration in a perspective view of the chuck stage 20 in the Z direction, a case where the arrangement of the electromagnetic elements 22a-1 to 22a-n is a combination of a cross-shaped arrangement in the XY direction and an oblique cross-shaped arrangement obtained by rotating the cross-shaped arrangement in the XY direction around the Z axis. The center of the cross-shaped arrangement and the center of the oblique cross-shaped arrangement are disposed near the center of the stage base 21.

The chuck unit 23 is disposed between the electromagnetic elements 22a-1 to 22a-n. The chuck unit 23 is a vacuum chuck mechanism or an electrostatic chuck mechanism. In a case where the chuck unit 23 is the vacuum chuck mechanism, as illustrated in FIG. 2, the chuck unit 23 includes a plurality of chuck holes 23a-1 to 23a-k, a vacuum pipe 23b, and a vacuum pump 23c. Each of the chuck holes 23a communicates with the vacuum pump 23c through the vacuum pipe 23b. The vacuum pump 23c can evacuate the chuck holes 23a through the vacuum pipe 23b in accordance with the control of the controller 60. This enables the chuck unit 23 to chuck the wafer.

The drive mechanism 24 collectively and globally moves the electromagnetic elements 22a-1 to 22a-n by driving the stage base 21 in the XYZ direction in accordance with the control of the controller 60. The electromagnetic elements 22a-1 to 22a-n are capable of individually generating the electromagnetic force in accordance with the control of the controller 60. Each of the electromagnetic elements 22a-1 to 22a-n is supported on the stage base 21 in such a manner that a principal part thereof is displaceable in the +Z direction and the −Z direction.

For example, each of the electromagnetic elements 22a has a vertically inverted configuration relative to the configuration illustrated in FIGS. 4A and 4B. In each of the electromagnetic elements 22a, a conducting wire connected to one end of a coil and a conducting wire connected to the other end of the coil are electrically connected between the coil and the controller 60, and current flows in a direction corresponding to the electromagnetic force to be generated in the coil. When current flows therethrough in the direction indicated by the dot-dot-dash line in the inverted configuration relative to the configuration of FIG. 4A, the electromagnetic element 22a functions as a magnet with a pressurizing surface on the +Z side serving as the N pole and a surface on the −Z side serving as the S pole. When current flows in the direction indicated by the dot-dash line in the inverted configuration relative to the configuration of FIG. 4A, the electromagnetic element 22a functions as a magnet with the pressurizing surface on the +Z side serving as the S pole and the surface on the −Z side serving as the N pole.

At this time, if the pressurizing surfaces of the electromagnetic elements 12a and 22a facing each other have different magnetic polarities, the electromagnetic elements 12a and 22a exert electromagnetic forces attracting each other as indicated by dotted arrows in FIG. 4C and can thus be respectively displaced in the −Z direction and +Z direction. If the pressurizing surfaces of the electromagnetic elements 12a and 22a have the same magnetic polarity, the electromagnetic elements 12a and 22a exert electromagnetic forces repelling each other as indicated by dotted arrows in FIG. 4D and can thus be respectively displaced in the +Z direction and −Z direction.

The imaging unit 25 illustrated in FIG. 2 is disposed between the electromagnetic elements 22a-1 to 22a-n (refer to FIG. 3). The imaging unit 25 includes a plurality of image pickup devices 25a-1 to 25a-k. The plurality of image pickup devices 25a-1 to 25a-k receives visible light or infrared light and captures an image of a reference mark on the wafer at alignment in accordance with the control of the controller 60. Each of the image pickup devices 25a-1 to 25a-k may include a camera including, for example, a CCD image sensor or a CMOS image sensor.

The controller 60 performs control so that a wafer W1 is chucked onto the chuck stage 10 and a wafer W2 is chucked onto the chuck stage 20. The controller 60 brings the chuck stage 10 with the wafer W1 chucked thereon and the chuck stage 20 with the wafer W2 chucked thereon relatively close to each other to bring the surface of the wafer W1 and the surface of the wafer W2 close to each other. The controller 60 controls the electromagnetic force generation unit 12 and the electromagnetic force generation unit 22 independently of each other in a state where the surface of the wafer W1 and the surface of the wafer W2 are close to each other. Further, the controller 60 controls the electromagnetic elements 12a-1 to 12a-n independently of each other and controls the electromagnetic elements 22a-1 to 22a-n independently of each other in the state where the surface of the wafer W1 and the surface of the wafer W2 are close to each other.

The controller 60 causes a plurality of sets each including the electromagnetic element 12a and the electromagnetic element 22a facing each other to generate the electromagnetic force that is two-dimensionally distributed and causes the pressurizing force that is two-dimensionally distributed to act between the upper wafer W1 and the lower wafer W2. In this manner, the controller 60 brings the upper wafer W1 and the lower wafer W2 into contact with each other and advances a contact end between the upper wafer W1 and the lower wafer W2 in the plane direction. For example, the controller 60, as time passes, increases the number of the electromagnetic elements 12a and 22a to be caused to generate the electromagnetic force among the plurality of electromagnetic elements 12a-1 to 12a-n and 22a-1 to 22a-n concentrically from the electromagnetic elements located at the center. That is, the controller 60, as time passes, gradually expands a region of the electromagnetic elements 12a and 22*a* to be caused to generate the electromagnetic force to a region R1, a region R2, a region R3, a region R4, a region R5, and a region R6 illustrated in FIG. 3 in this order. In this manner, the controller 60 brings the upper wafer W1 and the lower wafer W2 into contact with each other at the center and advances the contact end between the upper wafer W1 and the lower wafer W2 outward from the center. As a result, it is possible to bond the upper wafer W1 and the lower wafer W2 together while reducing the formation of voids (cavities) on a bonding interface. That is, the wafers W1 and W2 can be bonded together by applying a magnetic field/load in such a manner as to push air out from the centers of the wafers W1 and W2.

It should be noted that the contact end between the upper wafer W1 and the lower wafer W2 may be a predetermined location other than the center as long as the formation of voids can be reduced. Also in this case, the controller 60 gradually increases the number of the electromagnetic elements to be caused to generate the electromagnetic force among the plurality of electromagnetic elements 12*a*-1 to 12*a*-*n* and 22*a*-1 to 22*a*-*n* concentrically from the electromagnetic elements located at the predetermined location. This enables the controller 60 to bond the upper wafer W1 and the lower wafer W2 together by applying the magnetic field/load in such a manner as to push air out from the contact end between the wafers W1 and W2 by advancing the contact end between the wafers W1 and W2 in the plane direction.

Next, an operation of the substrate bonding apparatus 1 will be described with reference to FIGS. 5 to 13B. FIG. 5 is a flowchart illustrating the operation of the substrate bonding apparatus 1. FIGS. 6A to 13B are sectional views illustrating the operation of the substrate bonding apparatus 1.

The substrate bonding apparatus 1 performs loading of the wafer W1 and the wafer W2 (Wafer Loading) (S1). For example, as illustrated in FIG. 6A, the substrate bonding apparatus 1 keeps the chuck stage 10 and the chuck stage 20 separated from each other in the Z direction. At this time, the controller 60 keeps the chucking operation of the chuck unit 13 and the chuck unit 23 canceled and keeps the electromagnetic force generation of the electromagnetic force generation unit 12 and the electromagnetic force generation unit 22 canceled. The conveyance robot 2*c* takes the wafer W1 and the wafer W2 out of the loading/unloading unit 3. The conveyance robot 2*c* chucks the wafer W1 onto a +Z-side surface of an arm, chucks the wafer W2 onto a −Z-side surface of the arm, and passes the wafer W1 and the wafer W2 to the conveyance robot 2*a*. The conveyance robot 2*a* chucks the wafer W1 onto a +Z-side surface of an arm, chucks the wafer W2 onto a −Z-side surface of the arm, and conveys the wafer W1 and the wafer W2 to the chuck stage 10 and the chuck stage 20. The conveyance robot 2*a* moves the arm in the +Y direction and positions the wafer W1 and the wafer W2 between the chuck stage 10 and the chuck stage 20 in the Z direction as illustrated in FIG. 6B.

The substrate bonding apparatus 1 chucks the wafer W1 and the wafer W2 onto the chuck stage 10 and the chuck stage 20 (Wafer Chucking) (S2). For example, the conveyance robot 2*a* moves the arm in the −Z direction and places the wafer W2 on the principal surface 21*a* of the chuck stage 20 as illustrated in FIG. 7A. The controller 60 controls the chuck unit 23 (refer to FIG. 2) to cause the chuck unit 23 to chuck the wafer W2 onto the principal surface 21*a*. Along with this, the conveyance robot 2*a* releases the chucking of the wafer W2 on the −Z-side surface of the arm. Further, the conveyance robot 2*a* moves the arm in the +Z direction and places the wafer W1 on the principal surface 11*a* of the chuck stage 10 as illustrated in FIG. 7A. The controller 60 controls the chuck unit 13 (refer to FIG. 2) to cause the chuck unit 13 to chuck the wafer W1 onto the principal surface 11*a*. Along with this, the conveyance robot 2*a* releases the chucking of the wafer W1 on the +Z-side surface of the arm. The conveyance robot 2*a* moves the arm in the −Y direction, thereby retracting the arm from between the chuck stage 10 and the chuck stage 20 in the Z direction as illustrated in FIG. 7B.

Figure 8A:
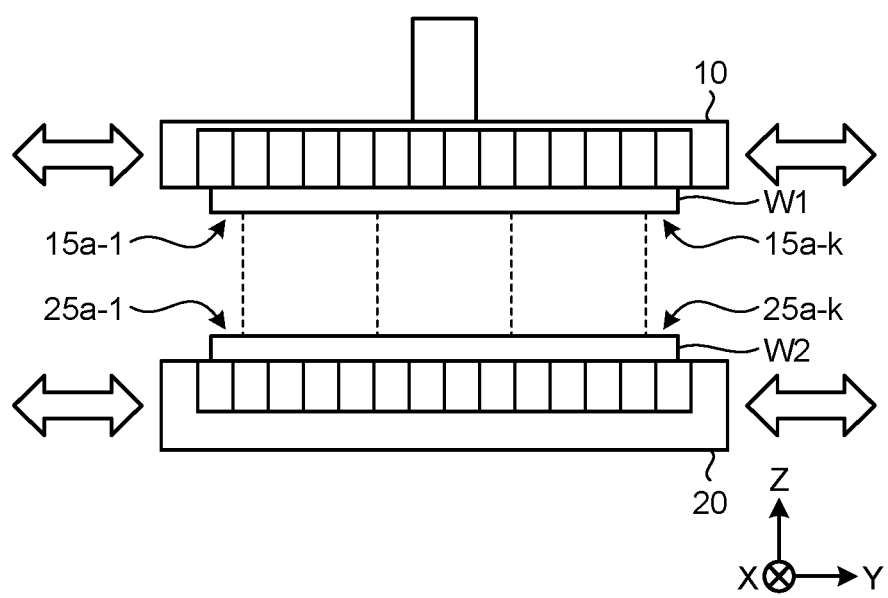
FIGS. 8A and 8B are diagrams illustrating the operation of the substrate bonding apparatus according to the embodiment.

The substrate bonding apparatus 1 performs pre-alignment on the wafer W1 and the wafer W2 (Pre-Alignment) (S3). The pre-alignment is alignment that roughly aligns relative XY positions of the wafer W1 and the wafer W2 with each other. For example, as illustrated in FIG. 8A, the substrate bonding apparatus 1 captures images of $N_1$ reference marks on the wafer W2 by using $N_1$ image pickup devices of the chuck stage 10, calculates a rough deviation $\Delta P_{12}$ from a target position for the XY position of the wafer W2, and drives the chuck stage 20 in the XY direction by using the drive mechanism 24 so as to correct the deviation $\Delta P_{12}$. The substrate bonding apparatus 1 captures images of $N_1$ reference marks on the wafer W1 by using $N_1$ image pickup devices of the chuck stage 20, calculates a rough deviation $\Delta P_{11}$ from a target position for the XY position of the wafer W1, and drives the chuck stage 10 in the XY direction by using the drive mechanism 14 so as to correct the deviation $\Delta P_{11}$.

It should be noted that the substrate bonding apparatus 1 may perform the pre-alignment by causing the chuck stages 10 and 20 to mutually capture images of reference marks on the chuck stages 10 and 20 and performing alignment.

The substrate bonding apparatus 1 performs fine-alignment on the wafer W1 and the wafer W2 (Fine-Alignment) (S4). The fine-alignment is alignment that finely aligns the relative XY positions of the waver W1 and the wafer W2 with each other based on the positions aligned through the pre-alignment. For example, as illustrated in FIG. 8A, the substrate bonding apparatus 1 captures images of $N_2$ ($>N_1$) reference marks on the wafer W2 by using $N_2$ image pickup devices of the chuck stage 10, calculates a fine deviation $\Delta P_{22}$ from the target position for the XY position of the wafer W2, and drives the chuck stage 20 in the XY direction by using the drive mechanism 24 so as to correct the deviation $\Delta P_{22}$. The substrate bonding apparatus 1 captures images of $N_2$ reference marks on the wafer W1 by using $N_2$ image pickup devices of the chuck stage 20, calculates a fine deviation $\Delta P_{21}$ from the target position for the XY position of the wafer W1, and drives the chuck stage 10 in the XY direction by using the drive mechanism 14 so as to correct the deviation $\Delta P_{21}$.

It should be noted that the substrate bonding apparatus 1 may perform the fine-alignment by causing the chuck stages 10 and 20 to mutually capture images of reference marks on the chuck stages 10 and 20 and performing alignment. Also, when misalignment between the wafer W1 and the wafer W2 is beyond the adjustable range, the process may be returned to S3 so as to be retried from the pre-alignment, or the process may be returned to S1 so as to be retried from the wafer loading.

Figure 8B:
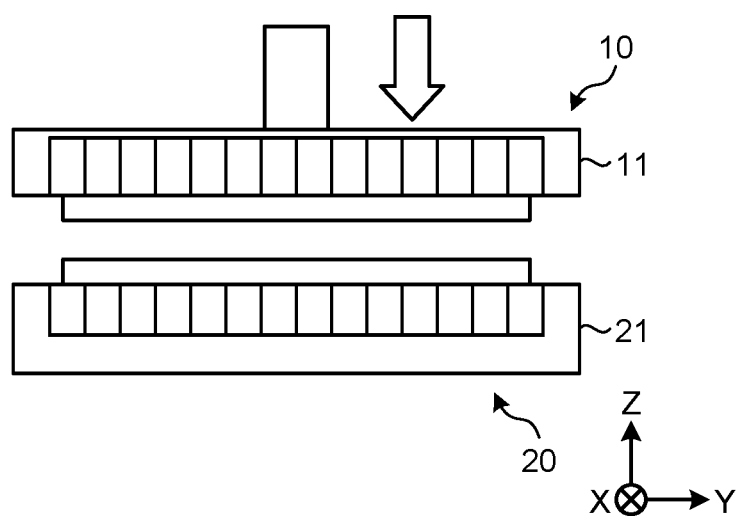
Figure 9A:
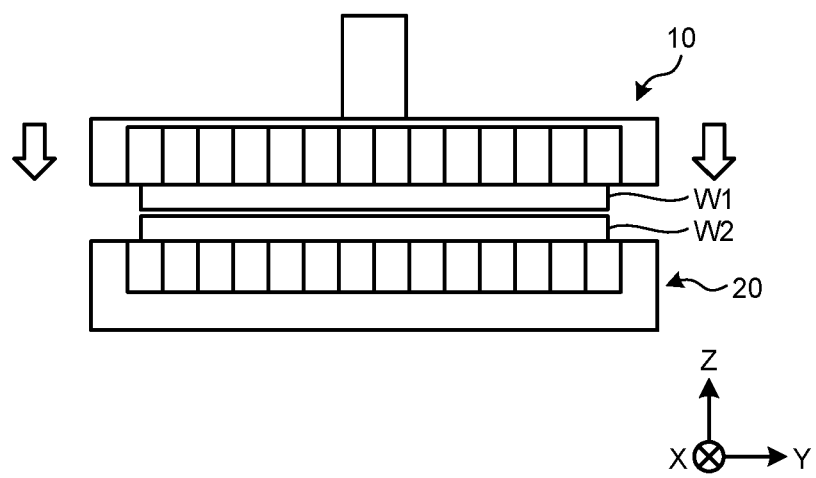
FIGS. 9A and 9B are diagrams illustrating the operation of the substrate bonding apparatus according to the embodiment.

The substrate bonding apparatus 1 brings the upper and lower chuck stages 10 and 20 relatively close to each other. For example, the substrate bonding apparatus 1 moves the upper chuck stage 10 downward (Upper-Stage move) (S5). As illustrated in FIG. 8B, the substrate bonding apparatus 1 moves the stage base 11 in the −Z direction by using the drive mechanism 14 with the position of the stage base 21 fixed. In this manner, the substrate bonding apparatus 1 brings the chuck stage 10 close to the chuck stage 20 in the Z direction. The substrate bonding apparatus 1 reduces the lowering speed of the stage base 11 by controlling the drive mechanism 14 immediately before the upper and lower wafers W1 and W2 come into contact with each other. After it is confirmed that the upper and lower wafers W1 and W2 have come into slight contact with the upper and lower electromagnetic force generation units 12 and 22 (checked by using, for example, a pressure sensor or a camera from the side faces), a lowering lock of the upper chuck stage 10 is released. Consequently, as illustrated in FIG. 9A, the own weight of the upper chuck stage 10 applies relatively small pressure to the upper and lower wafers W1 and W2. At this time, the pressure within the substrate bonding apparatus 1 is reduced. This allows residual gas to exhaust from the space between the wafers W1 and W2. That is, the reduction of pressure within the substrate bonding apparatus 1 makes it possible to prevent generation of the trapped gas bubbles (i.e., trapped voids, bonding failure) effectively.

Figure 9B:
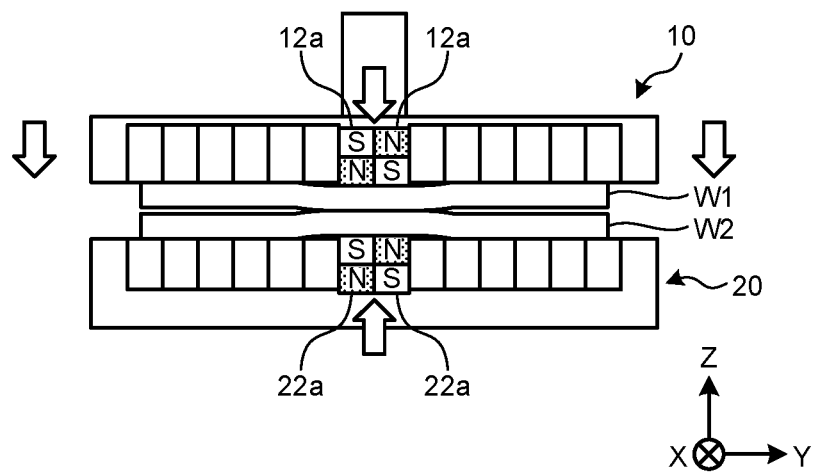

The substrate bonding apparatus 1 selectively causes the upper and lower electromagnetic force generation units 12 and 22 to generate the electromagnetic force at the center (Electromagnet-ON) (S6). As illustrated in FIG. 9B, the substrate bonding apparatus 1 selectively supplies control current to the electromagnetic elements 12a and 22a belonging to the region R1 (refer to FIG. 3) near the center. At this time, the substrate bonding apparatus 1 controls the direction of each control current so that the pressurizing surfaces of the electromagnetic elements 12a and 22a facing each other have different polarities. Further, the substrate bonding apparatus 1 controls the magnitude of each control current so that the magnitude of the pressurizing force applied to the upper and lower wafers W1 and W2 becomes an appropriate magnitude. In this manner, the substrate bonding apparatus 1 causes the pressurizing force to act on the upper and lower wafers W1 and W2 from the electromagnetic elements 12a and 22a and brings the upper and lower wafers W1 and W2 into contact with each other in the region R1.

The substrate bonding apparatus 1 gradually expands the region where the electromagnetic force is to be generated in the upper and lower electromagnetic force generation units 12 and 22 (Expansion) (S7). The substrate bonding apparatus 1 gradually increases the number of the electromagnetic elements 12a and 22a to be caused to generate the electromagnetic force among the plurality of electromagnetic elements 12a-1 to 12a-n and 22a-1 to 22a-n concentrically from the electromagnetic elements located at the center.

Figure 10A:
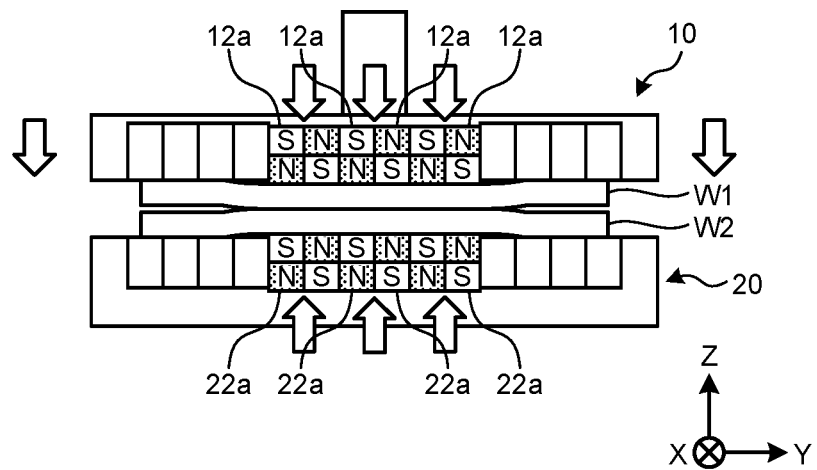
FIGS. 10A and 10B are diagrams illustrating the operation of the substrate bonding apparatus according to the embodiment.

As illustrated in FIG. 10A, the substrate bonding apparatus 1 selectively supplies control current to the electromagnetic elements 12a and 22a belonging to the region R2 (refer to FIG. 3). In this manner, the substrate bonding apparatus 1 advances the contact end between the upper wafer W1 and the lower wafer W2 from the position corresponding to the region R1 to the position corresponding to the region R2. Then, the substrate bonding apparatus 1 selectively supplies control current to the electromagnetic elements 12a and 22a belonging to the region R3 (refer to FIG. 3). In this manner, the substrate bonding apparatus 1 advances the contact end between the upper wafer W1 and the lower wafer W2 from the position corresponding to the region R2 to the position corresponding to the region R3.

Figure 10B:
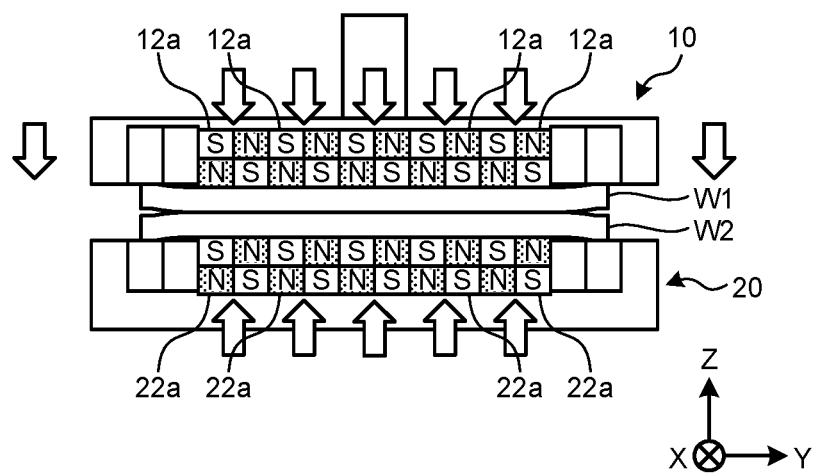

As illustrated in FIG. 10B, the substrate bonding apparatus 1 selectively supplies control current to the electromagnetic elements 12a and 22a belonging to the region R4 (refer to FIG. 3). In this manner, the substrate bonding apparatus 1 advances the contact end between the upper wafer W1 and the lower wafer W2 from the position corresponding to the region R3 to the position corresponding to the region R4. Then, the substrate bonding apparatus 1 selectively supplies control current to the electromagnetic elements 12a and 22a belonging to the region R5 (refer to FIG. 3). In this manner, the substrate bonding apparatus 1 advances the contact end between the upper wafer W1 and the lower wafer W2 from the position corresponding to the region R4 to the position corresponding to the region R5.

Figure 11A:
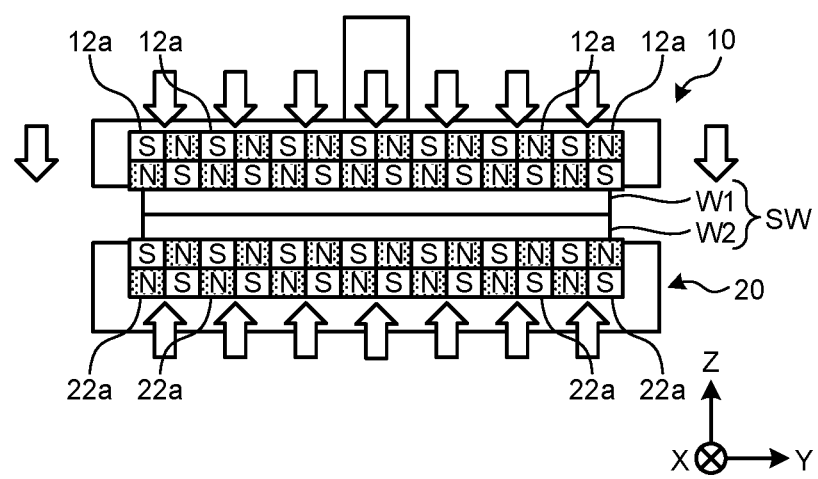
FIGS. 11A and 11B are diagrams illustrating the operation of the substrate bonding apparatus according to the embodiment.

As illustrated in FIG. 11A, the substrate bonding apparatus 1 selectively supplies control current to the electromagnetic elements 12a and 22a belonging to the region R6 (refer to FIG. 3). In this manner, the substrate bonding apparatus 1 advances the contact end between the upper wafer W1 and the lower wafer W2 from the position corresponding to the region R5 to the position corresponding to the region R6. Consequently, a stacked wafer SW including the wafer W1 and the wafer W2 bonded together is formed.

Figure 11B:
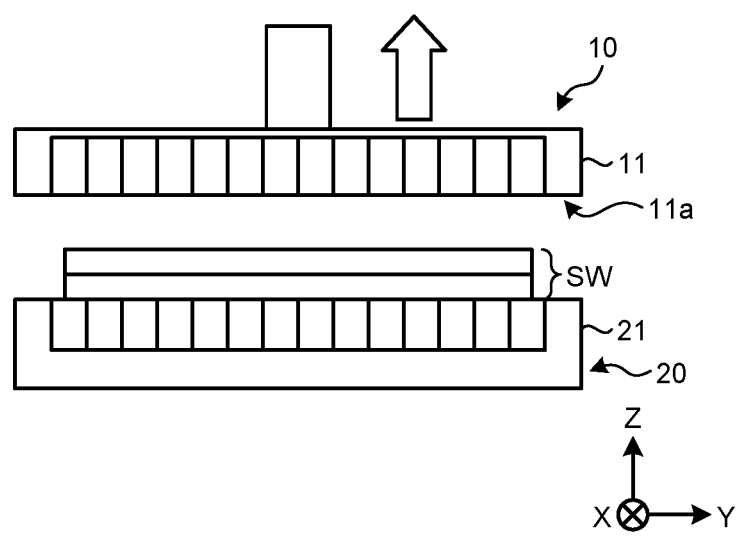

The substrate bonding apparatus 1 cancels the electromagnetic force generation of the upper and lower electromagnetic force generation units 12 and 22 after the pressure reaches a designated pressure (Electromagnet-Off) (S8). As illustrated in FIG. 11B, the substrate bonding apparatus 1 stops the supply of the control current to all the electromagnetic elements 12a and 22a. This stops the electromagnetic force generation of the upper and lower electromagnetic force generation units 12 and 22.

The substrate bonding apparatus 1 releases the chucking of the stacked wafer SW on the chuck stage 10 (Upper-Stage wafer Unchucking) (S9). As illustrated in FIG. 11B, the controller 60 controls the chuck unit 13 (refer to FIG. 2) to cause the chuck unit 13 to release the chucking of the stacked wafer SW on the principal surface 11a.

The substrate bonding apparatus 1 relatively moves the upper and lower chuck stages 10 and 20 away from each other. For example, the substrate bonding apparatus 1 moves the upper chuck stage 10 upward (Upper-stage move) (S10). As illustrated in FIG. 11B, the substrate bonding apparatus 1 moves the stage base 11 in the +Z direction by using the drive mechanism 14 with the position of the stage base 21 fixed. In this manner, the substrate bonding apparatus 1 moves the chuck stage 10 away from the chuck stage 20 in the Z direction.

Figure 12A:
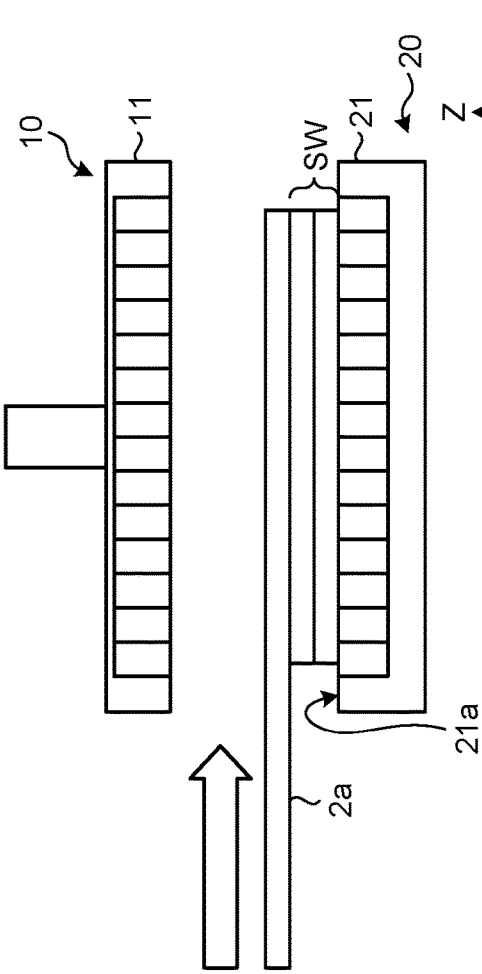
FIGS. 12A and 12B are diagrams illustrating the operation of the substrate bonding apparatus according to the embodiment.

The substrate bonding apparatus 1 releases the chucking of the stacked wafer SW on the chuck stage 20 (Lower-Stage wafer Unchucking) (S11). As illustrated in FIG. 12A, the controller 60 controls the chuck unit 23 (refer to FIG. 2) to cause the chuck unit 23 to release the chucking of the stacked wafer SW on the principal surface 21a.

The substrate bonding apparatus 1 performs unloading of the stacked wafer SW (Wafer Unload) (S12). For example, as illustrated in FIG. 12A, the conveyance robot 2a moves the arm in the +Y direction and positions the arm between the chuck stage 10 and the chuck stage 20 in the Z direction. The conveyance robot 2a moves the arm in the −Z direction and chucks the stacked wafer SW onto the −Z-side surface of the arm.

Figure 12B:
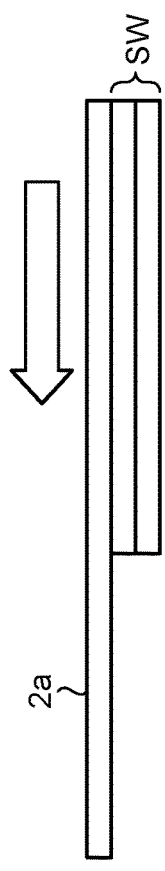

As illustrated in FIG. 12B, the conveyance robot 2a slightly moves the arm in the +Z direction and then moves the arm in the −Y direction, thereby retracting the stacked wafer SW from between the chuck stage 10 and the chuck stage 20 in the Z direction. The conveyance robot 2a passes the stacked wafer SW to the conveyance robot 2c. The conveyance robot 2c houses the stacked wafer SW into the loading/unloading unit 3. The stacked wafer SW is conveyed to an apparatus for the next step by another conveyance system.

The substrate bonding apparatus 1 performs cleaning and degaussing on the chuck stages 10 and 20 (Stage Cleaning Degaussing) (S13). For example, as illustrated in FIG. 13A, the substrate bonding apparatus 1 supplies, to the electromagnetic elements 12a, control current in a direction opposite to the direction at bonding so that the electromagnetic elements 12a generate magnetic force of a polarity opposite to the polarity at bonding (refer to FIG. 11A). Consequently, if there is a magnetized part in the chuck stage 10, it is possible to degauss the magnetized part. Similarly, the substrate bonding apparatus 1 supplies, to the electromagnetic elements 22a, control current in a direction opposite to the direction at bonding so that the electromagnetic elements 22a generate magnetic force of a polarity opposite to the polarity at bonding (refer to FIG. 11A). Thus, if there is a magnetized part in the chuck stage 20, it is possible to degauss the magnetized part.

As illustrated in FIG. 13B, the substrate bonding apparatus 1 stops the supply of the control current to all the electromagnetic elements 12a and 22a. This stops the electromagnetic force generation of each of the electromagnetic elements 12a and 22a. At this time, since the chuck stage 10 and the chuck stage 20 are degaussed, magnetic dust MD can be easily removed.

Then, the substrate bonding apparatus 1 loads the next wafers W1' and W2' thereon and performs the processes following S1 on the wafers W1' and W2'.

As described above, in the substrate bonding apparatus 1 according to the embodiment, the upper and lower chuck stages 10 and 20 are respectively provided with the electromagnetic force generation units 12 and 22 capable of two-dimensionally adjusting the magnetic force. This makes it possible to achieve the bond following the topography of the wafer surfaces while reducing magnetic dust.

Figure 14:
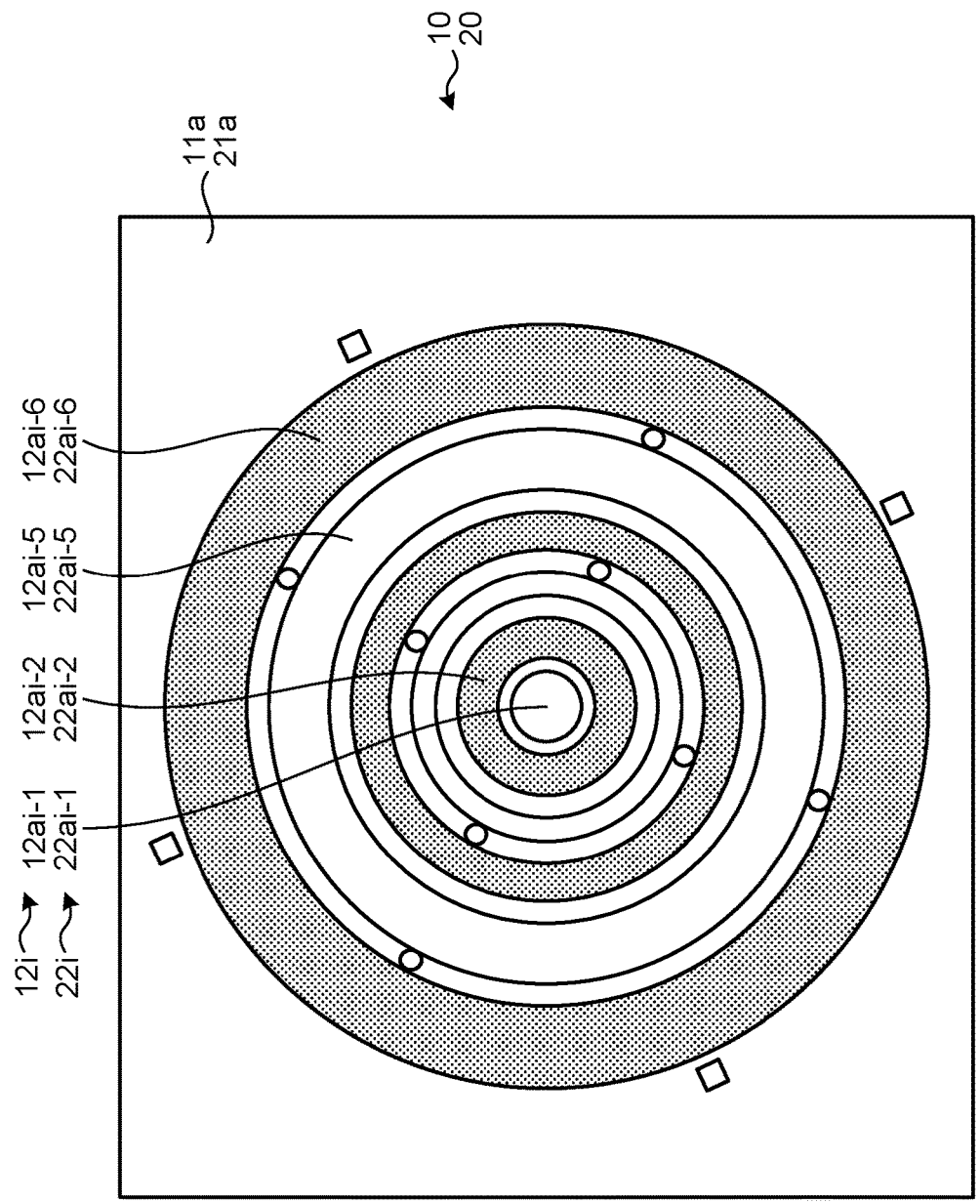
FIG. 14 is a diagram illustrating the configuration of a chuck stage in a first modification of the embodiment.

It should be noted that the arrangement of the plurality of electromagnetic elements 12a and 22a of the electromagnetic force generation units 12 and 22 is not limited to the radial arrangement as long as the electromagnetic elements 12a and 22a are two-dimensionally arranged on the principal surfaces 11a and 21a of the stage bases 11 and 21 of the chuck stages 10 and 20. For example, as illustrated in FIG. 14, a plurality of electromagnetic elements 12ai and 22ai of electromagnetic force generation units 12i and 22i may be concentrically arranged on the principal surfaces 11a and 21a of the stage bases 11 and 21 of the chuck stages 10 and 20. FIG. 14 is a diagram illustrating the configuration of the chuck stages 10 and 20 according to a first modification of the embodiment. Electromagnetic elements 12ai-1 and 22ai-1 can be regarded as a plurality of electromagnetic elements integrated together corresponding to the region R1 of the embodiment (refer to FIG. 3). The electromagnetic elements 12ai-1 and 22ai-1 have a substantially circular shape in XY plane view. Electromagnetic elements 12ai-2 and 22ai-2 are disposed annularly surrounding the electromagnetic elements 12ai-1 and 22ai-1 away from the electromagnetic elements 12ai-1 and 22ai-1 and can be regarded as a plurality of electromagnetic elements integrated together corresponding to the region R2 of the embodiment (refer to FIG. 3). Electromagnetic elements 12ai-6 and 22ai-6 are disposed annularly surrounding electromagnetic elements 12ai-5 and 22ai-5 away from the electromagnetic elements 12ai-5 and 22ai-5 and can be regarded as a plurality of electromagnetic elements integrated together corresponding to the region R6 of the embodiment (refer to FIG. 3).

According to the configuration in which the plurality of electromagnetic elements 12ai and 22ai is concentrically arranged on the principal surfaces 11a and 21a of the stage bases 11 and 21 in this manner, it is easy for the controller 60 to bring the upper and lower wafers into contact with each other at the center and advance the contact end between the upper and lower wafers outward from the center.

Figure 15:
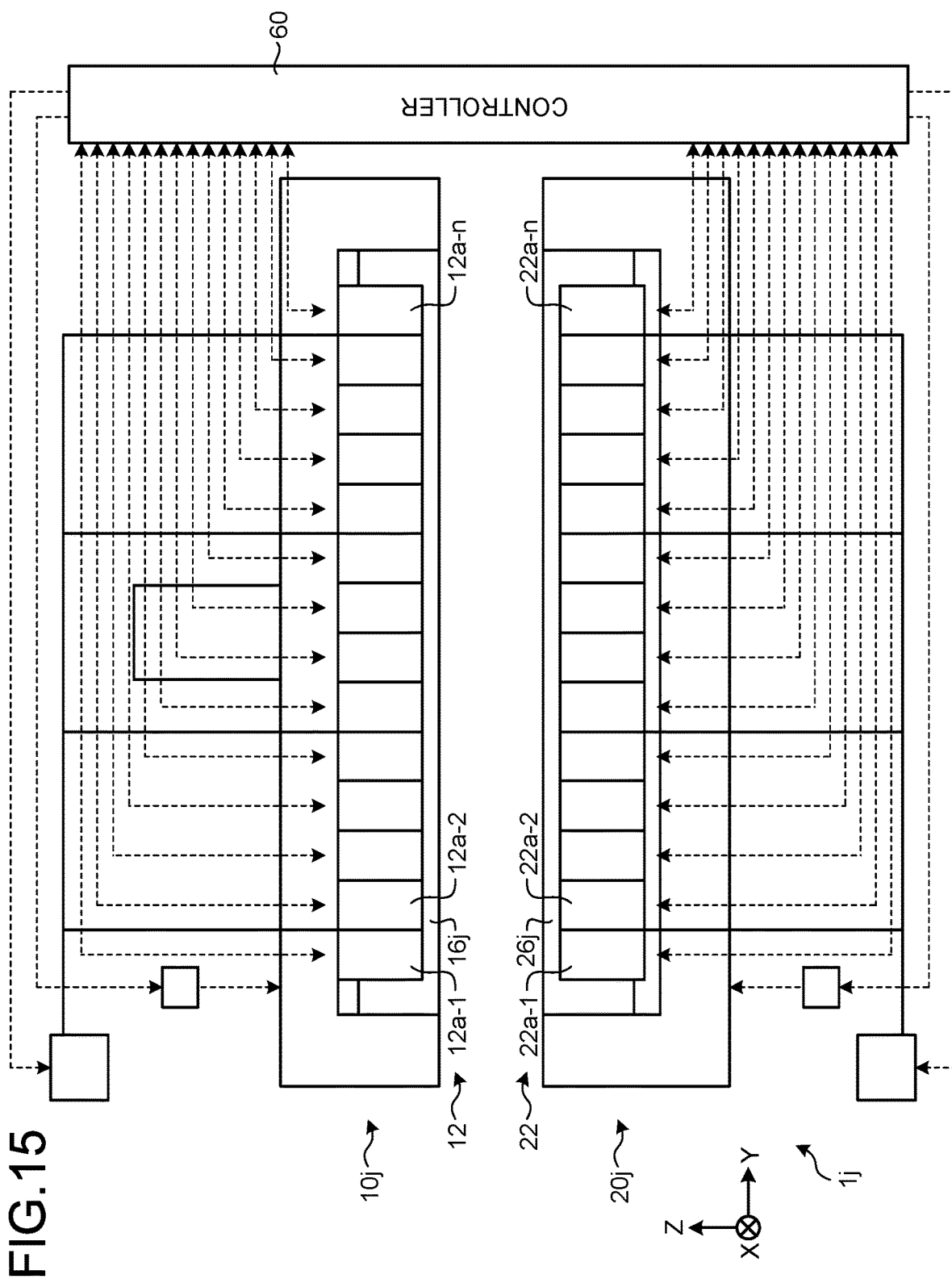
FIG. 15 is a diagram illustrating the configuration of a substrate bonding apparatus according to a second modification of the embodiment.

Alternatively, as illustrated in FIG. 15, a substrate bonding apparatus 1j may include elastic members 16j and 26j. The elastic members 16j and 26j may cover the plurality of electromagnetic elements 12a and 22a of the electromagnetic force generation units 12 and 22. FIG. 15 is a diagram illustrating the configuration of the substrate bonding apparatus 1j according to a second modification of the embodiment.

The elastic member 16j mainly extends in the XY direction and is housed in the recess of the stage base 11. The elastic member 16j also planarly covers the plurality of electromagnetic elements 12a-1 to 12a-n of the electromagnetic force generation unit 12. The elastic member 16j may further cover a part of the side face of the outermost electromagnetic element 12a among the plurality of the electromagnetic elements 12a-1 to 12a-n. The elastic member 16j can include, for example, an elastic body such as rubber. The surface of the elastic member 16j constitutes the surface of the chuck stage 10. In each of the electromagnetic elements 12a-1 to 12a-n, the cushioning member 12a3 and the elastic member 12a8 (refer to FIG. 4A) may be omitted, and the pressurizing surface 12a6 of the housing 12a1 may be fixed to the back surface of the elastic member 16j. This enables the controller 60 to change the surface shape of the chuck stage 10j in any manner by controlling Z-displacements of the respective electromagnetic elements 12a-1 to 12a-n independently of each other.

The elastic member 26j mainly extends in the XY direction and is housed in the recess of the stage base 21. The elastic member 26j also planarly covers the plurality of electromagnetic elements 22a-1 to 22a-n of the electromagnetic force generation unit 22. The elastic member 26j may further cover a part of the side face of the outermost electromagnetic element 22a among the plurality of the electromagnetic elements 22a-1 to 22a-n. The elastic member 26j can include, for example, an elastic body such as rubber. The elastic member 26j may be integrally formed as one member and planarly cover the plurality of electromagnetic elements 22a-1 to 22a-n. The surface of the elastic member 26j constitutes the surface of the chuck stage 20. In each of the electromagnetic elements 22a-1 to 22a-n, the cushioning member 22a3 and the elastic member 22a8 (refer to FIG. 4A) may be omitted, and the pressurizing surface 22a6 of the housing 22a1 may be fixed to the back surface of the elastic member 26j. This enables the controller 60 to change the surface shape of the chuck stage 20j in any manner by controlling Z-displacements of the respective electromagnetic elements 22a-1 to 22a-n independently of each other.

The controller 60 may, as time passes, increase the number of the electromagnetic elements 12a and 22a to be caused to generate the electromagnetic force among the plurality of electromagnetic elements 12a-1 to 12a-n and 22a-1 to 22a-n concentrically from the electromagnetic elements located at the center and two-dimensionally change the amount of control current supplied to the electromagnetic elements 12a and 22a.

Figure 16:
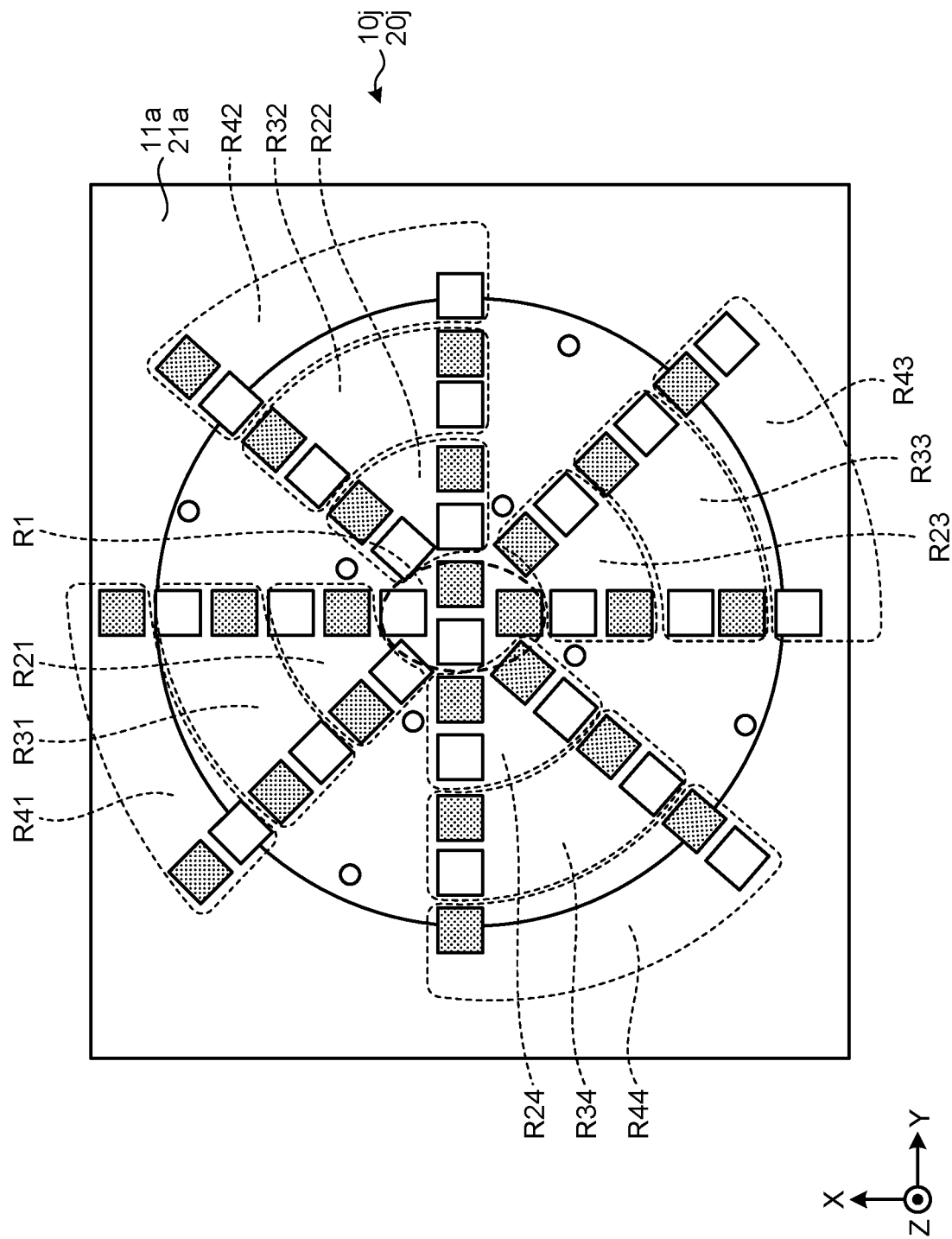
FIG. 16 is a diagram illustrating the configuration of a chuck stage in the second modification of the embodiment.

For example, the controller 60 gradually expands the region of the electromagnetic elements 12a and 22a to be caused to generate the electromagnetic force to the region R1, the regions R21, R22, R23, and R24, the regions R31, R32, R33, and R34, and the regions R41, R42, R43, and R44 illustrated in FIG. 16 in this order. FIG. 16 is a diagram illustrating the configuration of chuck stages 10j and 20j according to the second modification of the embodiment. FIG. 16 illustrates a plane configuration in a state where the elastic members 16j and 26j are eliminated. In this case, the amount of control current supplied to the electromagnetic elements 12a and 22a may differ between the regions R21, R22, R23, and R24, the amount of control current supplied to the electromagnetic elements 12a and 22a may differ between the regions R31, R32, R33, and R34, or the amount of control current supplied to the electromagnetic elements 12a and 22a may differ between the regions R41, R42, R43, and R44.

For example, as illustrated in FIGS. 17A to 19B, the substrate bonding apparatus 1j may perform an operation of changing the surface shapes of the chuck stages 10j and 20j corresponding to the back surface shapes of the wafers. FIGS. 17A to 19B are diagrams illustrating the operation of the substrate bonding apparatus 1j.

Figure 17A:
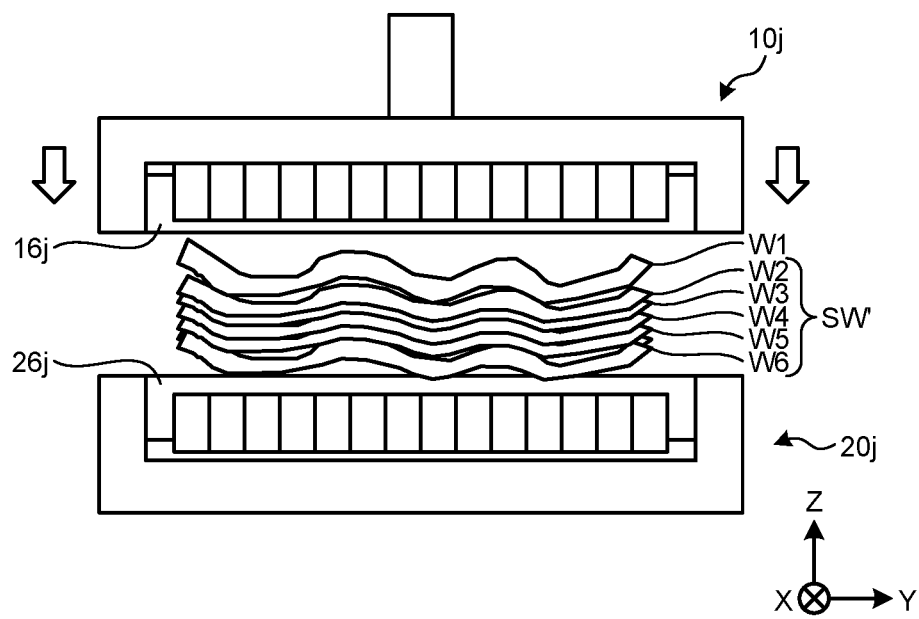
FIGS. 17A and 17B are diagrams illustrating an operation of the substrate bonding apparatus according to the second modification of the embodiment.

The substrate bonding apparatus 1j chucks the wafer W1 by using the chuck stage 10 and chucks a stacked wafer SW' by using the chuck stage 20. The stacked wafer SW' includes a plurality of wafers W6 to W2 staked in order. The substrate bonding apparatus 1j moves the upper chuck stage 10 downward. After it is confirmed that the upper wafer W1 and the lower stacked wafer SW' have come into slight contact with the upper and lower elastic members 16j and 26j, the substrate bonding apparatus 1j releases a lowering lock of the upper chuck stage 10. Consequently, as illustrated in FIG. 17A, the own weight of the upper chuck stage 10j applies relatively small pressure to the upper wafer W1 and the lower stacked wafer SW'.

Figure 17B:
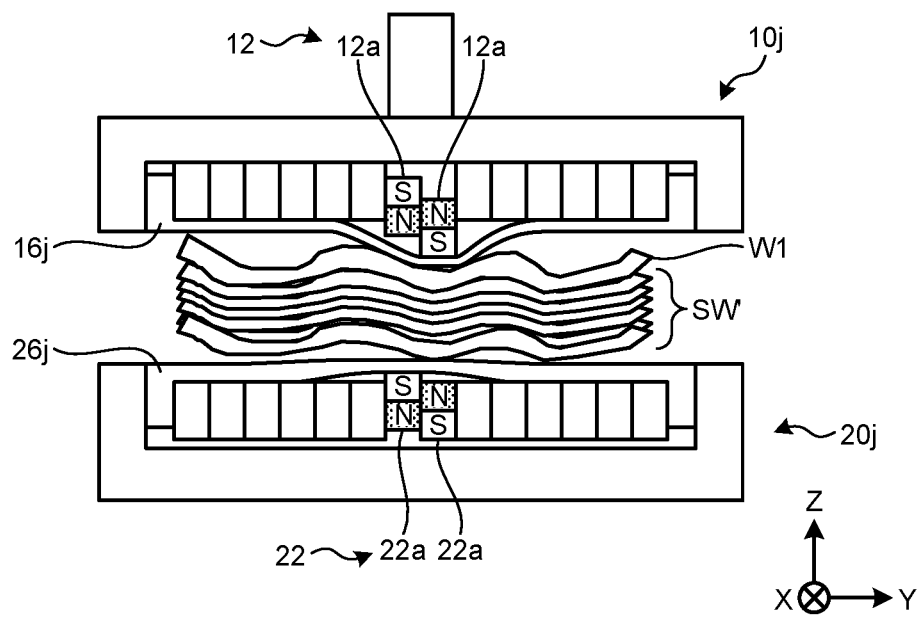

As illustrated in FIG. 17B, the substrate bonding apparatus 1j selectively supplies control current to the electromagnetic elements 12a and 22a belonging to the region R1 (refer to FIG. 16) near the center. At this time, the substrate bonding apparatus 1j controls the direction of each control current so that the pressurizing surfaces of the electromagnetic elements 12a and 22a facing each other have different polarities. Further, the substrate bonding apparatus 1j controls the magnitude of each control current so that the magnitude of the pressurizing force applied to the upper wafer W1 and the lower stacked wafer SW' becomes an appropriate magnitude. In this manner, the substrate bonding apparatus 1j causes the pressurizing force to act on the upper wafer W1 and the lower stacked wafer SW' from the electromagnetic elements 12a and 22a through the elastic members 16j and 26j and brings the upper wafer W1 and the lower stacked wafer SW' into contact with each other in the region R1.

At this time, the elastic members 16j and 26j deform following the back surface shapes of the wafer W1 and the stacked wafer SW' in the region R1. This enables the substrate bonding apparatus 1j to easily increase the contact area of the upper and lower chuck stages 10j and 20j with the wafer W1 and the stacked wafer SW' when pressure is applied and disperse stress within the back surface shapes when pressure is applied.

Figure 18A:
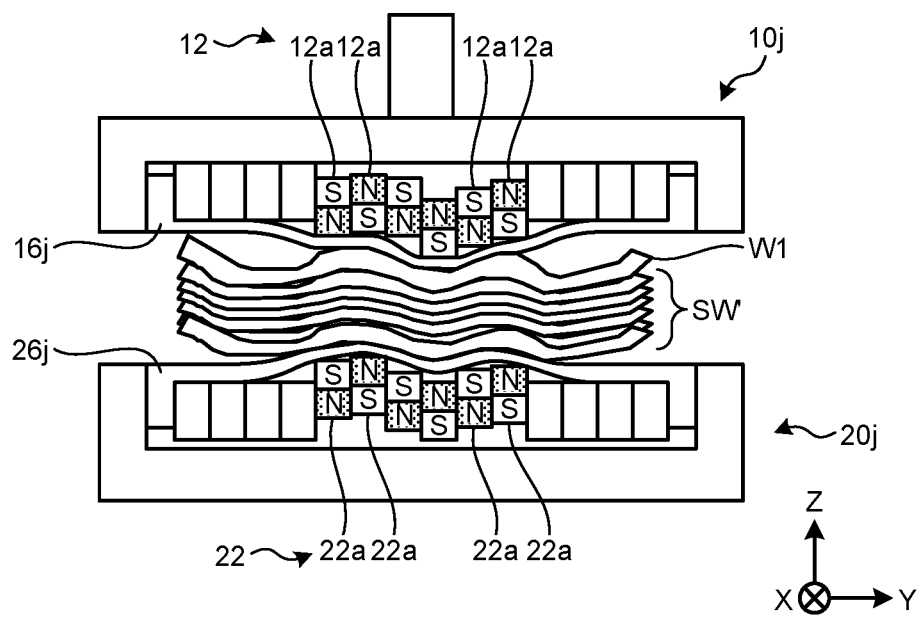
FIGS. 18A and 18B are diagrams illustrating the operation of the substrate bonding apparatus according to the second modification of the embodiment.

As illustrated in FIG. 18A, the substrate bonding apparatus 1j selectively supplies control current to the electromagnetic elements 12a and 22a belonging to the regions R21, R22, R23, and R24 (refer to FIG. 16).

At this time, the substrate bonding apparatus 1j may make the amount of control current supplied to the electromagnetic elements 12a and 22a different between the regions R21, R22, R23, and R24 according to the back surface shapes of the wafer W1 and the stacked wafer SW'. Consequently, the elastic members 16j and 26j deform following the back surface shapes of the wafer W1 and the stacked wafer SW' in the regions R21, R22, R23, and R24. This enables the substrate bonding apparatus 1j to easily increase the contact area with the upper wafer W1 and the lower stacked wafer SW' when pressure is applied while advancing the contact end between the wafer W1 and the stacked wafer SW' from the position corresponding to the region R1 to the position corresponding to the regions R21 to R24 and disperse stress within the back surface shapes when pressure is applied.

Figure 18B:
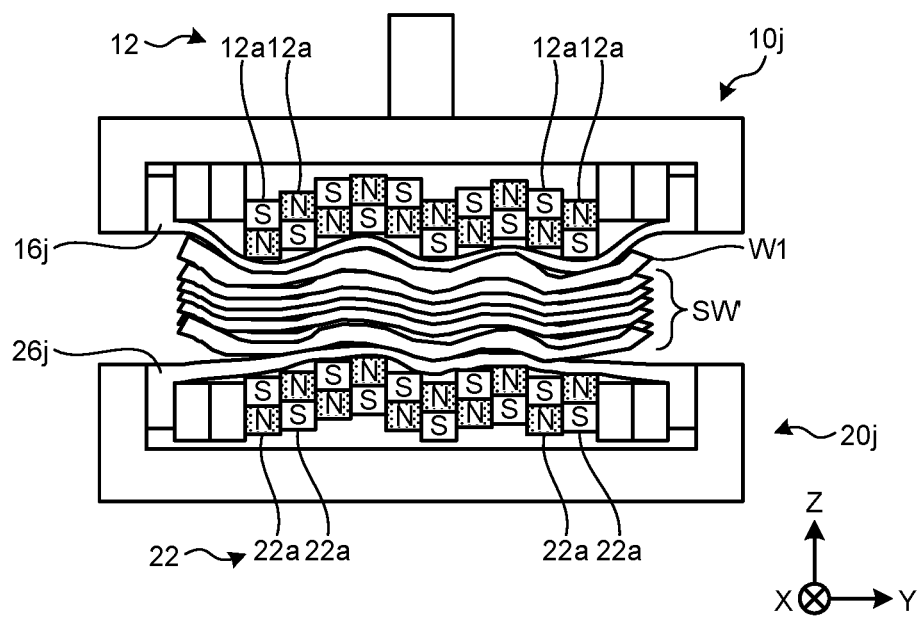

As illustrated in FIG. 18B, the substrate bonding apparatus 1j selectively supplies control current to the electromagnetic elements 12a and 22a belonging to the regions R31, R32, R33, and R34 (refer to FIG. 16).

At this time, the substrate bonding apparatus 1j may make the amount of control current supplied to the electromagnetic elements 12a and 22a different between the regions R31, R32, R33, and R34 according to the back surface shapes of the wafer W1 and the stacked wafer SW'. Consequently, the elastic members 16j and 26j deform following the back surface shapes of the wafer W1 and the stacked wafer SW' in the regions R31, R32, R33, and R34. This enables the substrate bonding apparatus 1j to easily increase the contact area with the upper wafer W1 and the lower stacked wafer SW' when pressure is applied while advancing the contact end between the wafer W1 and the stacked wafer SW' from the position corresponding to the regions R21 to R24 to the position corresponding to the regions R31 to R34 and disperse stress within the back surface shapes when pressure is applied.

Figure 19A:
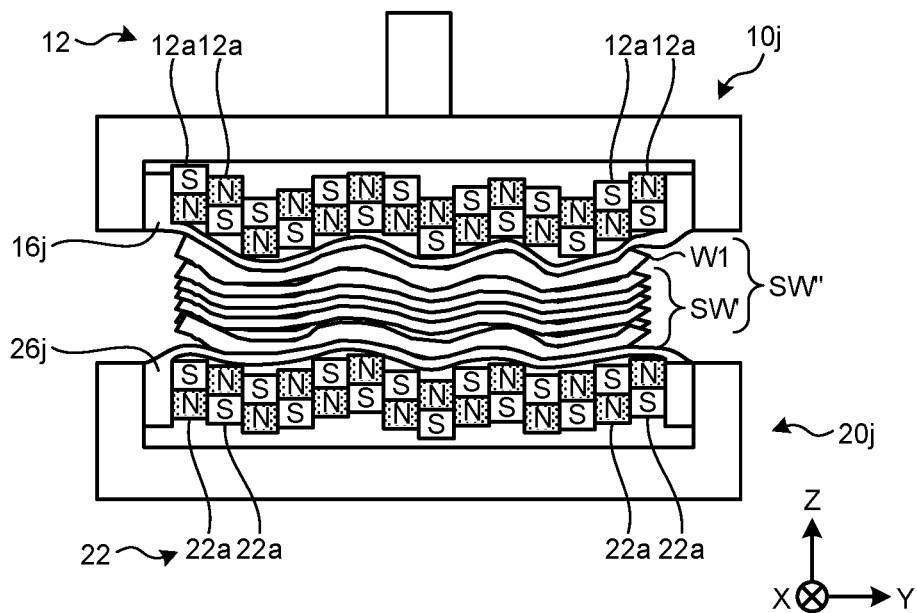
FIGS. 19A and 19B are diagrams illustrating the operation of the substrate bonding apparatus according to the second modification of the embodiment.

As illustrated in FIG. 19A, the substrate bonding apparatus 1j selectively supplies control current to the electromagnetic elements 12a and 22a belonging to the regions R41, R42, R43, and R44 (refer to FIG. 16).

At this time, the substrate bonding apparatus 1j may make the amount of control current supplied to the electromagnetic elements 12a and 22a different between the regions R41, R42, R43, and R44 according to the back surface shapes of the wafer W1 and the stacked wafer SW'. Consequently, the elastic members 16j and 26j deform following the back surface shapes of the wafer W1 and the stacked wafer SW' in the regions R41, R42, R43, and R44. This enables the substrate bonding apparatus 1j to easily increase the contact area with the upper wafer W1 and the lower stacked wafer SW' when pressure is applied while advancing the contact end between the wafer W1 and the stacked wafer SW' from the position corresponding to the regions R31 to R34 to the position corresponding to the regions R41 to R44 and disperse stress at the pressurized location. Consequently, a stacked wafer SW'' including the wafer W1 and the stacked wafer SW' bonded together is formed.

Figure 19B:
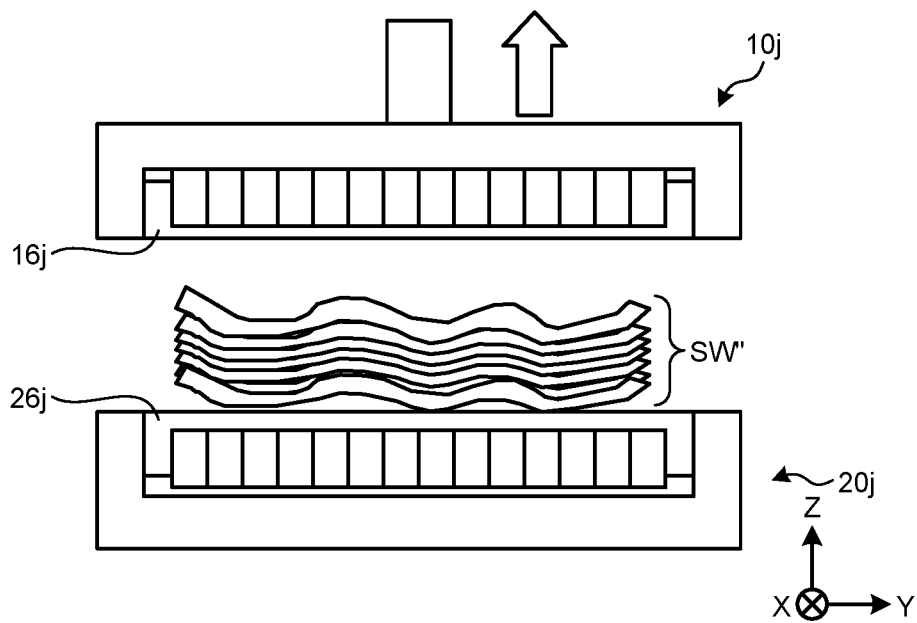

As illustrated in FIG. 19B, the controller 60 controls the chuck unit 13 (refer to FIG. 2) to cause the chuck unit 13 to release the chucking of the stacked wafer SW'' on the principal surface. The substrate bonding apparatus 1j moves the stage base 11 in the +Z direction by using the drive mechanism 14 with the position of the stage base 21 fixed. In this manner, the substrate bonding apparatus 1j moves the chuck stage 10j away from the chuck stage 20j in the Z direction.

In this way, according to the configuration in which the elastic members 16*j* and 26*j* cover the plurality of electromagnetic elements 12*a* and 22*a* of the electromagnetic force generation units 12 and 22, it is possible to cause the pressurizing force to act between wafers to be bonded together from the upper and lower electromagnetic force generation units 12 and 22 through the elastic members 16*j* and 26*j*. This makes it possible to achieve bonding more accurately following the topography of the wafer surfaces, disperse stress at the pressurized location at bonding, and prevent damage of the wafers to be bonded together.

Alternatively, as illustrated in FIG. 20, a plurality of electromagnetic elements 12*ai* and 22*ai* of electromagnetic force generation units 12*k* and 22*k* may be concentrically arranged on principal surfaces 11*a* and 21*a* of chuck stages 10*k* and 20*k* and also two-dimensionally divided. FIG. 20 is a diagram illustrating the configuration of the chuck stages 10*k* and 20*k* according to a third modification of the embodiment. FIG. 20 illustrates a plane configuration in a state where the elastic members 16*j* and 26*j* are eliminated. Electromagnetic elements 12*ak*-1 and 22*ak*-1 can be regarded as a plurality of electromagnetic elements integrated together corresponding to the region R1 of the second modification (refer to FIG. 16). The electromagnetic elements 12*ak*-1 and 22*ak*-1 have a substantially circular shape in XY plane view. Electromagnetic elements 12*ak*-21 to 12*ak*-28 and 22*ak*-21 to 22*ak*-28 are disposed annularly surrounding the electromagnetic elements 12*ak*-1 and 22*ak*-1 away from the electromagnetic elements 12*ak*-1 and 22*ak*-1 and can be regarded as a plurality of electromagnetic elements integrated together corresponding to the regions R21 to R24 of the second modification (refer to FIG. 16). The electromagnetic elements 12*ak*-21, 12*ak*-25, 22*ak*-21, and 22*ak*-25 correspond to the region R21. The electromagnetic elements 12*ak*-22, 12*ak*-26, 22*ak*-22, and 22*ak*-26 correspond to the region R22. The electromagnetic elements 12*ak*-23, 12*ak*-27, 22*ak*-23, and 22*ak*-27 correspond to the region R23. The electromagnetic elements 12*ak*-24, 12*ak*-28, 22*ak*-24, and 22*ak*-28 correspond to the region R24 . . . . Electromagnetic elements 12*ak*-41 to 12*ak*-44 and 22*ak*-41 to 22*ak*-44 are disposed annularly surrounding electromagnetic elements 12*ak*-31 to 12*ak*-38 and 22*ak*-31 to 22*ak*-38 away from the electromagnetic elements 12*ak*-31 to 12*ak*-38 and 22*ak*-31 to 22*ak*-38 and can be regarded as a plurality of electromagnetic elements integrated together corresponding to the regions R41 to R44 of the second modification (refer to FIG. 16). The electromagnetic elements 12*ak*-41 and 22*ak*-41 correspond to the region R41. The electromagnetic elements 12*ak*-42 and 22*ak*-42 correspond to the region R42. The electromagnetic elements 12*ak*-43 and 22*ak*-43 correspond to the region R43. The electromagnetic elements 12*ak*-44 and 22*ak*-44 correspond to the region R44.

According to the configuration in which the plurality of electromagnetic elements 12*ak* and 22*ak* is concentrically arranged on the principal surfaces 11*a* and 21*a* of the stage bases 11 and 21 and also two-dimensionally divided in this manner, the controller 60 can easily increase the contact area between the upper and lower wafers when pressure is applied while bringing the upper and lower wafers into contact with each other at the center and advancing the contact end between the upper and lower wafers outward from the center and easily disperse stress at the pressurized location.

Figure 21:
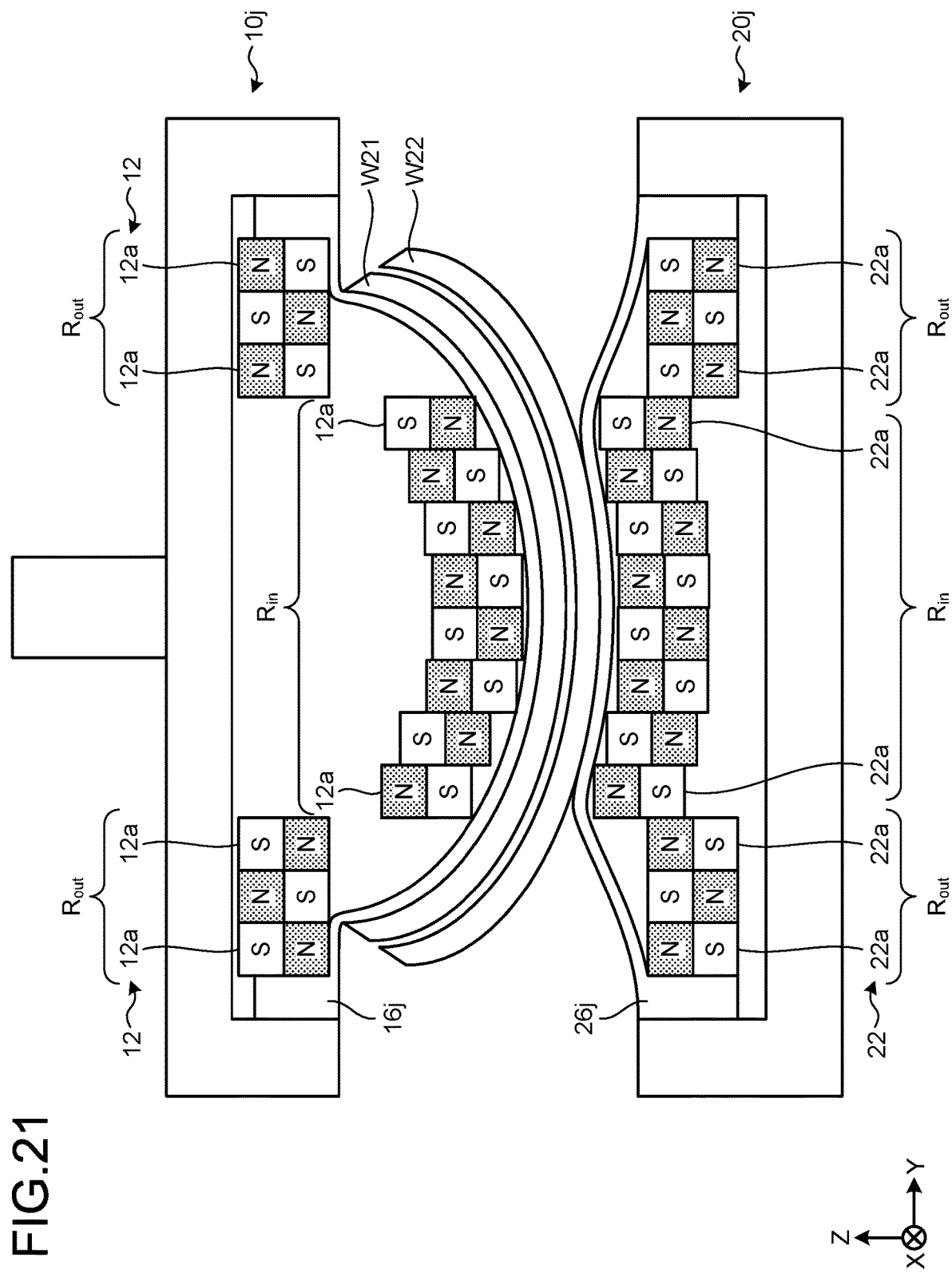
FIG. 21 is a diagram illustrating an operation of a substrate bonding apparatus according to a fourth modification of the embodiment.

Alternatively, as illustrated in FIG. 21, in the substrate bonding apparatus 1*j*, the controller 60 may control the electromagnetic force generation units 12 and 22 so that a region where the upper and lower electromagnetic elements 12*a* and 22*a* facing each other have different polarities and a region where the upper and lower electromagnetic elements 12*a* and 22*a* facing each other have the same polarity are present in a mixed manner. FIG. 21 is a diagram illustrating an operation of a substrate bonding apparatus 1*j* according to a fourth modification of the embodiment.

For example, in a case where the back surface shapes of upper and lower wafers W21 and W22 are warped in bowl-like shapes, and a height difference therebetween is relatively large, the controller 60 performs control so that the upper and lower electromagnetic elements 12*a* and 22*a* facing each other in an inner region Rin have different polarities and the upper and lower electromagnetic elements 12*a* and 22*a* facing each other in an outer region Rin have the same polarity. Consequently, the upper and lower electromagnetic elements 12*a* and 22*a* facing each other in the inner region Rin attract each other, whereas the upper and lower electromagnetic elements 12*a* and 22*a* facing each other in the outer region Rout repel each other. Thus, the elastic members 16*j* and 26*j* can be deformed with a large height difference following the warped bowl-like shapes. Therefore, in a case where the back surface shapes of the upper and lower wafers have a large height difference, it is possible to achieve a bonding operation following the back surface shapes of the upper and lower wafers.

(Supplementary Item 1)

A method of manufacturing a semiconductor device comprising:
  generating electromagnetic force in a first chuck stage that chucks a first semiconductor substrate by supplying a current to a first electromagnetic force generation unit included in the first chuck stage, and generating electromagnetic force in a second chuck stage that chucks a second semiconductor substrate by supplying a current to a second electromagnetic force generation unit included in the second chuck stage; and
  expanding a region to generate the electromagnetic force in the first chuck stage by supplying the current to the first electromagnetic force generation unit and expanding a region to generate the electromagnetic force in the second chuck stage by supplying the current to the second electromagnetic force generation unit,
  the method further comprising:
  loading the first semiconductor substrate and the second semiconductor substrate into a substrate bonding apparatus;
  chucking the first semiconductor substrate with the first chuck stage and chucking the second semiconductor substrate with the second chuck stage;
  capturing an image of a reference mark on the first semiconductor substrate with a first image sensor and capturing an image of a reference mark on the second semiconductor substrate with a second image sensor to align the first semiconductor substrate and the second semiconductor substrate;
  after making the first semiconductor substrate and the second semiconductor substrate close to each other, expanding the region to generate the electromagnetic force in the first chuck stage and expanding the region to generate the electromagnetic force in the second chuck stage to bond the first semiconductor substrate and the second semiconductor substrate to form a stacked substrate;
  carrying the stacked substrate out from the substrate bonding apparatus; and after carrying out the stacked substrate, degaussing the first chuck stage and the second chuck stage.
(Supplementary Item 2)
A method of manufacturing a semiconductor device comprising:
generating electromagnetic force in a first chuck stage that chucks a first semiconductor substrate by supplying a current to a first electromagnetic force generation unit included in the first chuck stage, and generating electromagnetic force in a second chuck stage that chucks a second semiconductor substrate by supplying a current to a second electromagnetic force generation unit included in the second chuck stage; and
expanding a region to generate the electromagnetic force in the first chuck stage by supplying the current to the first electromagnetic force generation unit and expanding a region to generate the electromagnetic force in the second chuck stage by supplying the current to the second electromagnetic force generation unit,
the method further comprising:
loading the first semiconductor substrate and the second semiconductor substrate into a substrate bonding apparatus;
chucking the first semiconductor substrate with the first chuck stage and chucking the second semiconductor substrate with the second chuck stage;
capturing an image of a reference mark on the first semiconductor substrate with a first image sensor and capturing an image of a reference mark on the second semiconductor substrate with a second image sensor to align the first semiconductor substrate and the second semiconductor substrate;
after making the first semiconductor substrate and the second semiconductor substrate close to each other, reducing a pressure within the substrate bonding apparatus;
expanding the region to generate the electromagnetic force in the first chuck stage and expanding the region to generate the electromagnetic force in the second chuck stage to bond the first semiconductor substrate and the second semiconductor substrate to form a stacked substrate; and
carrying the stacked substrate out from the substrate bonding apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A substrate bonding apparatus comprising:
a first chuck stage including a first electromagnetic force generation unit, the first chuck stage being chuckable for a first substrate; and
a second chuck stage including a second electromagnetic force generation unit, the second electromagnetic force generation unit facing the first electromagnetic force generation unit, the second chuck stage being chuckable for a second substrate.
2. The substrate bonding apparatus according to claim 1, wherein
the first chuck stage has a first chuck surface,
the first electromagnetic force generation unit includes a plurality of first electromagnetic elements arranged along a direction parallel to the first chuck surface,
the second chuck stage has a second chuck surface, and
the second electromagnetic force generation unit includes a plurality of second electromagnetic elements arranged along a direction parallel to the second chuck surface.
3. The substrate bonding apparatus according to claim 2, further comprising a controller that controls the first electromagnetic force generation unit and the second electromagnetic force generation unit independently of each other.
4. The substrate bonding apparatus according to claim 2, wherein
the first chuck stage further includes a first chuck unit, the first chuck unit being disposed between the first electromagnetic elements and capable of chucking the first substrate, and
the second chuck stage further includes a second chuck unit, the second chuck unit being disposed between the second electromagnetic elements and capable of chucking the second substrate.
5. The substrate bonding apparatus according to claim 4, wherein
the first chuck stage further includes a first image sensor, the first image sensor being disposed between the first electromagnetic elements and capable of capturing an image of a reference mark on the first substrate, and
the second chuck stage further includes a second image sensor, the second image sensor being disposed between the second electromagnetic elements and capable of capturing an image of a reference mark on the second substrate.
6. The substrate bonding apparatus according to claim 4, further comprising a controller that controls one element of the first electromagnetic elements and another element different from the one element of the first electromagnetic elements independently of each other and that controls one element of the second electromagnetic elements and another element different from the one element of the second electromagnetic elements independently of each other.
7. The substrate bonding apparatus according to claim 6, wherein
the controller controls adjoining two elements among the plurality of first electromagnetic elements to become different poles, and controls adjoining two elements among the plurality of second electromagnetic elements to become different poles.
8. The substrate bonding apparatus according to claim 6, wherein
the controller increases, as time passes, the number of the first electromagnetic elements to generate electromagnetic force among the plurality of the first electromagnetic elements, and increases, as time passes, the number of the second electromagnetic elements to generate electromagnetic force among the plurality of the second electromagnetic elements.
9. The substrate bonding apparatus according to claim 6, wherein
the controller changes, as time passes, the first electromagnetic elements to generate electromagnetic force among the plurality of the first electromagnetic elements from that in a center region of the first chuck surface to that in an outer region of the first chuck surface, and changes, as time passes, the second electromagnetic elements to generate electromagnetic force among the plurality of the second electromagnetic elements from that in a center region of the second chuck surface to that in an outer region of the second chuck surface.

10. The substrate bonding apparatus according to claim 6, wherein
the controller causes one pair of the first electromagnetic element and the second electromagnetic element among multiple pairs of the first electromagnetic elements and the second electromagnetic elements, each pair of the first electromagnetic element and the second electromagnetic element facing each other to generate magnetic forces of opposite polarities.

11. The substrate bonding apparatus according to claim 6, wherein
the controller causes one pair of the first electromagnetic element and the second electromagnetic element among multiple pairs of the first electromagnetic elements and the second electromagnetic elements, each pair of the first electromagnetic element and the second electromagnetic element facing each other to generate magnetic forces of the same polarity.

12. The substrate bonding apparatus according to claim 1, wherein
the first chuck stage further includes a first elastic member covering the first electromagnetic force generation unit on a side corresponding to the first substrate, and
the second chuck stage further includes a second elastic member covering the second electromagnetic force generation unit on a side corresponding to the second substrate.

13. The substrate bonding apparatus according to claim 2, wherein
the first chuck stage further includes a first elastic member covering the plurality of first electromagnetic elements on a side corresponding to the first substrate, the first elastic member being constructed integrally, and
the second chuck stage further includes a second elastic member covering the plurality of second electromagnetic elements on a side corresponding to the second substrate, the second elastic member being constructed integrally.

14. The substrate bonding apparatus according to claim 13, further comprising a controller that controls the first electromagnetic elements independently of each other according to a back surface shape of the first substrate and that controls the second electromagnetic elements independently of each other according to a back surface shape of the second substrate.

15. The substrate bonding apparatus according to claim 14, wherein
the controller causes one pair of the first electromagnetic element and the second electromagnetic element among multiple pairs of the first electromagnetic elements and the second electromagnetic elements, each pair of the first electromagnetic element and the second electromagnetic element facing each other to generate magnetic forces of opposite polarities.

16. The substrate bonding apparatus according to claim 14, wherein
the controller causes one pair of the first electromagnetic element and the second electromagnetic element among multiple pairs of the first electromagnetic elements and the second electromagnetic elements, each pair of the first electromagnetic element and the second electromagnetic element facing each other to generate magnetic forces of the same polarity.

17. The substrate bonding apparatus according to claim 2, wherein
the plurality of first electromagnetic elements are controlled independently of each other,
the plurality of second electromagnetic elements are controlled independently of each other,
a first electromagnetic element supplied with a current among the plurality of first electromagnetic elements generates electromagnetic force,
a second electromagnetic element supplied with a current among the plurality of second electromagnetic elements generates electromagnetic force.

* * * * *